(12) United States Patent
Nguyen et al.

(10) Patent No.: US 9,896,769 B2
(45) Date of Patent: Feb. 20, 2018

(54) INDUCTIVELY COUPLED PLASMA SOURCE WITH MULTIPLE DIELECTRIC WINDOWS AND WINDOW-SUPPORTING STRUCTURE

(71) Applicant: APPLIED MATERIALS, INC., Santa Clara, CA (US)

(72) Inventors: Andrew Nguyen, San Jose, CA (US); Kenneth S. Collins, San Jose, CA (US); Kartik Ramaswamy, San Jose, CA (US); Shahid Rauf, Pleasanton, CA (US); James D. Carducci, Sunnyvale, CA (US); Douglas A. Buchberger, Jr., Livermore, CA (US); Ankur Agarwal, Fremont, CA (US); Jason A. Kenney, Sunnyvale, CA (US); Leonid Dorf, San Jose, CA (US); Ajit Balakrishna, Sunnyvale, CA (US); Richard Fovell, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 993 days.

(21) Appl. No.: 13/666,280

(22) Filed: Nov. 1, 2012

(65) Prior Publication Data
US 2014/0020837 A1 Jan. 23, 2014

Related U.S. Application Data

(60) Provisional application No. 61/673,937, filed on Jul. 20, 2012.

(51) Int. Cl.
*C23C 16/00* (2006.01)
*H01L 21/306* (2006.01)
(Continued)

(52) U.S. Cl.
CPC ............ *C23F 1/08* (2013.01); *B01J 12/002* (2013.01); *C23C 14/28* (2013.01);
(Continued)

(58) Field of Classification Search
CPC ................ H01J 37/321; H01J 37/3211; H01J 37/32119; H01J 37/32128;
(Continued)

(56) References Cited

U.S. PATENT DOCUMENTS 5,571,366 A * 11/1996 Ishii .................. H01J 37/32082
118/723 I
5,620,523 A 4/1997 Maeda et al.
(Continued)

FOREIGN PATENT DOCUMENTS

JP 2004-200429 A 7/2004
KR 10-2004-0102300 A 12/2004
(Continued)

OTHER PUBLICATIONS

Official Action Dated Feb. 10, 2016 Issued in Co-Pending U.S. Appl. No. 13/897,592.
(Continued)

*Primary Examiner* — Luz Alejandro Mulero
(74) *Attorney, Agent, or Firm* — Fish & Richardson P.C.

(57) ABSTRACT

A plasma reactor enclosure has a metallic portion and a dielectric portion of plural dielectric windows supported on the metallic portion, each of the dielectric windows extending around an axis of symmetry. Plural concentric coil antennas are disposed on an external side of the enclosure, respective ones of the coil antennas facing respective ones of the dielectric windows.

15 Claims, 22 Drawing Sheets

(51) Int. Cl.
*C23F 1/08* (2006.01)
*C23C 14/28* (2006.01)
*H05H 1/46* (2006.01)
*B01J 12/00* (2006.01)
*H01J 37/32* (2006.01)

(52) U.S. Cl.
CPC ..... *H01J 37/3211* (2013.01); *H01J 37/32733* (2013.01); *H01J 37/32834* (2013.01); *H05H 1/46* (2013.01)

(58) Field of Classification Search
CPC .......... H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 5,792,272 A | 8/1998 | van Os et al. | |
| 5,897,713 A | 4/1999 | Tomioka et al. | |
| 5,948,704 A | 9/1999 | Benjamin et al. | |
| 6,024,826 A * | 2/2000 | Collins | H01J 37/32082 118/723 E |
| 6,051,073 A * | 4/2000 | Chu | H01J 37/321 118/723 E |
| 6,083,344 A | 7/2000 | Hanawa et al. | |
| 6,089,182 A * | 7/2000 | Hama | C23C 16/00 118/723 AN |
| 6,129,808 A | 10/2000 | Wicker et al. | |
| 6,200,412 B1 | 3/2001 | Kilgore et al. | |
| 6,326,597 B1 * | 12/2001 | Lubomirsky | H01L 21/67248 118/723 R |
| 6,367,410 B1 * | 4/2002 | Leahey | H01L 21/67103 118/58 |
| 6,414,648 B1 * | 7/2002 | Holland | H01J 37/321 118/723 I |
| 6,450,117 B1 | 9/2002 | Murugeshi et al. | |
| 6,451,161 B1 * | 9/2002 | Jeng | H01J 37/321 118/723 I |
| 6,518,190 B1 | 2/2003 | Lill et al. | |
| 6,527,911 B1 | 3/2003 | Yen et al. | |
| 6,899,787 B2 * | 5/2005 | Nakano | H01J 37/32183 118/723 AN |
| 8,858,754 B2 | 10/2014 | Horiguchi et al. | |
| 8,933,628 B2 | 1/2015 | Banna et al. | |
| 2001/0019048 A1 * | 9/2001 | Ose | H05B 3/141 219/463.1 |
| 2002/0038791 A1 | 4/2002 | Okumura et al. | |
| 2002/0121345 A1 * | 9/2002 | Chen | C23C 16/507 156/345.48 |
| 2003/0213434 A1 * | 11/2003 | Gondhalekar | C23C 16/507 118/724 |
| 2004/0083971 A1 | 5/2004 | Holland et al. | |
| 2005/0178748 A1 | 8/2005 | Buchberger et al. | |
| 2005/0252885 A1 | 11/2005 | Tachino et al. | |
| 2005/0257743 A1 | 11/2005 | Koshiishi et al. | |
| 2007/0023145 A1 | 2/2007 | Bera et al. | |
| 2009/0159213 A1 | 6/2009 | Bera et al. | |
| 2009/0159425 A1 | 6/2009 | Liu et al. | |
| 2009/0162262 A1 | 6/2009 | Bera et al. | |
| 2009/0250169 A1 | 10/2009 | Carducci et al. | |
| 2009/0294065 A1 * | 12/2009 | Lai | H01J 37/3244 156/345.47 |
| 2010/0132615 A1 | 6/2010 | Kato et al. | |
| 2011/0094996 A1 | 4/2011 | Yamazawa et al. | |
| 2011/0222038 A1 | 9/2011 | Yamashita et al. | |
| 2012/0073756 A1 | 3/2012 | Yamazawa | |
| 2012/0090990 A1 | 4/2012 | Cox | |
| 2012/0248066 A1 | 10/2012 | Yamazawa | |
| 2013/0256271 A1 | 10/2013 | Panagopoulos et al. | |
| 2013/0278141 A1 | 10/2013 | Dorf et al. | |
| 2013/0278142 A1 | 10/2013 | Dorf et al. | |
| 2013/0284370 A1 | 10/2013 | Collins et al. | |
| 2015/0068682 A1 | 3/2015 | Banna et al. | |
| 2015/0087157 A1 | 3/2015 | Aubuchon et al. | |

FOREIGN PATENT DOCUMENTS

| | | |
|---|---|---|
| KR | 10-2009-0102257 A | 9/2009 |
| TW | 201006955 | 2/2010 |
| WO | WO-2008/088110 A1 | 7/2008 |

OTHER PUBLICATIONS

Official Action Dated Feb. 10, 2016 Issued in Co-Pending U.S. Appl. No. 14/270,578.
Carducci et al., U.S. Appl. No. 13/629,267, filed Sep. 27, 2012, 25 pages.
Nguyen et al., U.S. Appl. No. 13/666,224, filed Nov. 1, 2012, 55 pages.
Nguyen et al., U.S. Appl. No. 13/666,245, filed Nov. 1, 2012, 59 pages.
Nguyen et al., U.S. Appl. No. 13/666,280, filed Nov. 1, 2012, 60 pages.
Kenney et al., U.S. Appl. No. 13/897,585, filed May 20, 2013, 79 pages.
Kenney et al., U.S. Appl. No. 13/897,592, filed May 20, 2013, 79 pages.
Carducci et al., U.S. Appl. No. 13/966,614, filed Aug. 14, 2013, 88 pages.
Nguyen et al., U.S. Appl. No. 14/270,578, filed May 6, 2014, 94 pages.
Kenney et al., U.S. Appl. No. 14/294,431, filed Jun. 3, 2014, 97 pages.
Carducci et al., U.S. Appl. No. 14/319,089, filed Jun. 30, 2014, 88 pages.
U.S. Non-Final Office Action in U.S. Appl. No. 13/666,245, dated Mar. 9, 2016, 16 pages.
U.S. Non-Final Office Action in U.S. Appl. No. 13/666,614, dated Apr. 22, 2015, 13 pages.

* cited by examiner

INDUCTIVELY COUPLED PLASMA SOURCE WITH MULTIPLE DIELECTRIC WINDOWS AND WINDOW-SUPPORTING STRUCTURE

CROSS-REFERENCE TO RELATED APPLICATION

This application claims the benefit of U.S. Provisional Application Ser. No. 61/673,937, filed Jul. 20, 2012 entitled SYMMETRICAL MULTIPLE COAXIAL ICP SOURCE AND SYMMETRICAL FLOW CHAMBER, by Andrew Nguyen, et al.

BACKGROUND

Field:

Embodiments of the present invention are generally concerned with a plasma processing reactor chamber for processing workplaces, in which plasma is generated by inductive coupling of RF power to process gases inside the chamber.

Description of the Related Art:

Electronic devices such as integrated circuits, flat panel displays and the like, are fabricated by a series of processes, in which thin film layers are deposited on substrates and etched into desired patterns. The process steps may include plasma-enhanced reactive ion etching (RIE), plasma-enhanced chemical vapor deposition (CVD), plasma-enhanced physical vapor deposition (PVD).

Uniform distribution of etch rate or deposition rate across the entire surface of the substrate is essential for successful fabrication. Such uniformity is becoming more difficult to achieve, as substrate size is increasing and device geometry is shrinking. In particular, inductively coupled plasma sources can have two concentrically arranged coil antennas over the chamber ceiling, so that uniformity of etch rate distribution can be optimized by adjusting the different RF power levels delivered to the different coil antennas. As workpiece diameter and chamber diameter increase, we have found this approach is not adequate, as the larger size increases the difficultly of attaining the requisite process uniformity. Various sources of process non-uniformity, such as chamber design asymmetries, temperature distribution non-uniformities and gas distribution control become more important.

SUMMARY

A plasma reactor includes an enclosure having an axis of symmetry and a workpiece support within the enclosure, the workpiece support and the enclosure defining a processing region. The enclosure includes a metallic portion and a dielectric portion including plural dielectric windows supported on the metallic portion, each of the dielectric windows extending around the axis of symmetry, the enclosure having a diameter greater than the diameter of at least one of the dielectric windows. Plural concentric coil antennas are disposed on an external side of the enclosure, respective ones of the coil antennas facing respective ones of the dielectric windows. Respective RF power sources are coupled to respective ones of the coil antennas.

In one embodiment, a first one of the dielectric windows includes a disk-shaped dielectric window, the enclosure having a diameter greater than the diameter of the disk-shaped dielectric window. A second one of the dielectric windows is a cylindrical dielectric window. The cylindrical dielectric window is below a plane of the disk-shaped dielectric window.

In an embodiment, the metallic portion includes: (a) a cylindrical chamber body wall surrounding the cylindrical dielectric window, and (b) an annular top gas plate including a peripheral portion supported on the chamber body wall, and a central opening through the annular top gas plate, wherein the disk-shaped dielectric window includes a circular edge portion supported on an edge of the central opening.

The disk-shaped dielectric window has a diameter less than the diameter of the chamber body wall. A gap separates the chamber body wall from the disk-shaped dielectric window, the peripheral portion of the top gas plate spanning the gap and the disk-shaped dielectric window is suspended over the central opening of the top gas plate.

In an embodiment, first and second ones of the coil antennas are concentrically disposed over the disk-shaped dielectric window, and a third one of the coil antennas has a diameter exceeding a diameter of the cylindrical dielectric window and surrounds the cylindrical dielectric window.

The plasma reactor may further include a center gas disperser in a center of the disk-shaped dielectric ceiling and disposed to spray gas into the processing region, and the top gas plate may include: (a) plural gas injection orifices circularly arranged about the peripheral portion, (b) plural gas supply ports, and (c) a first hierarchy of equal length recursive gas flow paths from a first one of the gas supply ports to the plural gas injection orifices.

The center gas disperser may include a pair of opposing input ports, the reactor further including at least a pair of opposing gas flow conduits extending radially across the disk-shaped dielectric window to the opposing input ports of the center gas disperser. And, the top gas plate further includes a second hierarchy of equal length recursive gas flow paths from a second one of the gas supply ports to the pair of gas flow conduits.

The plasma reactor may further include a first heater layer on the disk-shaped dielectric window and including a radially outer portion and plural fingers extending radially inwardly from the radially outer portion. In an embodiment, the pair of opposing gas flow conduits is enclosed in respective ones of the plural fingers of first heater layer. The plasma reactor may further include a second heater layer on the cylindrical dielectric window, the second heater layer including a grid of axial fingers.

In an embodiment, the plasma reactor further includes: (a) a cylindrical shield coaxial with the axis of symmetry and located between the first and second coil antennas and facing an inner radial portion of the disk-shaped dielectric window, (b) a top fan plenum in a central air flow path including having an axial path passing through an interior of the cylindrical shield and a radial path extending across a surface of the disk-shaped dielectric window, and (c) plural intake fans coupled to the top fan plenum. In one embodiment, an annular air flow plate overlies the disk-shaped dielectric window and has a center air flow aperture open to the interior of the cylindrical shield and forming a top boundary of the radial path of the central air flow path. The annular air flow plate confines the radial path to regions between the plural fingers of the first heater layer.

In an embodiment, a side air flow passage is defined between the cylindrical dielectric window and cylindrical chamber body side wall, and the plasma reactor further includes: (a) a side fan plenum at an axial location between the top fan plenum and the cylindrical dielectric window, the side fan plenum open to the side air flow passage and including plural side fan plenum openings, and (b) plural exhaust fans at the plural side fan plenum openings.

An embodiment further includes: (a) an RF power-feed assembly coupled to the plural coil antennas and including plural conductive legs, (b) a ground plate extending radially and having openings through which respective ones of the legs extend, the ground plate providing a boundary between an upper region in which at least some of the plural conductive legs are distributed asymmetrically and a lower region in which the respective ones the legs are distributed symmetrically with respect to the axis of symmetry, and (c) wherein the ground plate includes a circular center aperture aligned with the axial path of the central air flow path.

A first temperature sensor may be provided at the disk-shaped dielectric window and a second temperature sensor may be provided at the cylindrical dielectric window, with a controller coupled to the first and second temperature sensors, the controller being coupled to govern levels of power delivered respectively to the first heater layer, the second heater layer, the plural intake fans, the plural exhaust fans, and to respective ones of the coil antennas. In an embodiment, the controller is programmed to control the power levels delivered to the first heater layer and the plural intake fans in response to an output of the first temperature sensor. The controller is further programmed to control the power levels delivered to the second heater layer and the plural exhaust fans in response to an output of the second temperature sensor.

In one embodiment, the plasma reactor further includes an exhaust chamber assembly, the exhaust chamber assembly including; (a) an exhaust chamber wall defining an evacuation region at a side of the workplace support opposite the processing region, the exhaust chamber assembly having an exhaust pump port symmetrically located relative to the axis of symmetry, and (b) plural axial exhaust passages between the processing region and the evacuation region, and symmetrically distributed with respect to the axis of symmetry.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
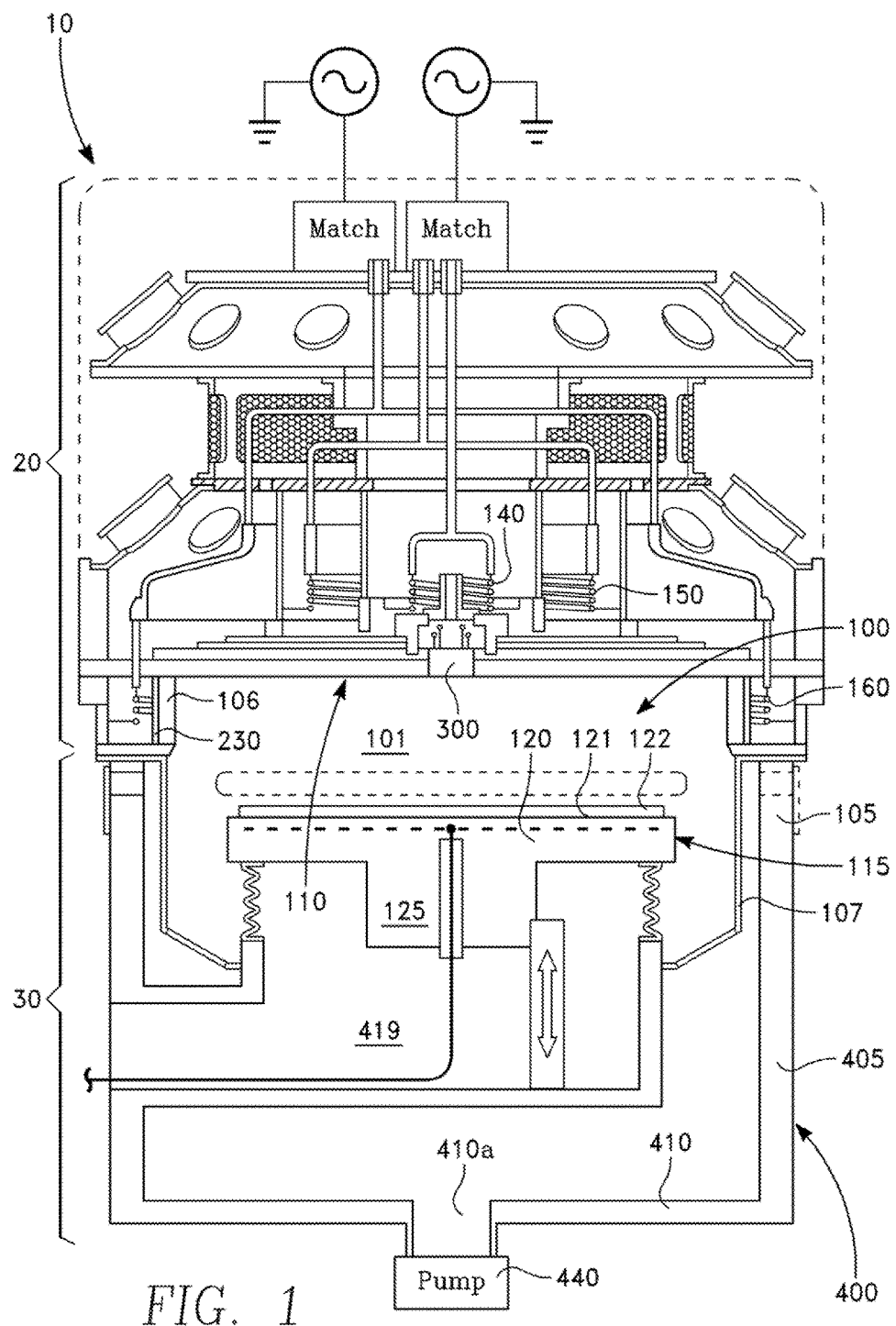
FIG. 1 is a cut-away view of a plasma reactor of an embodiment the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1A:
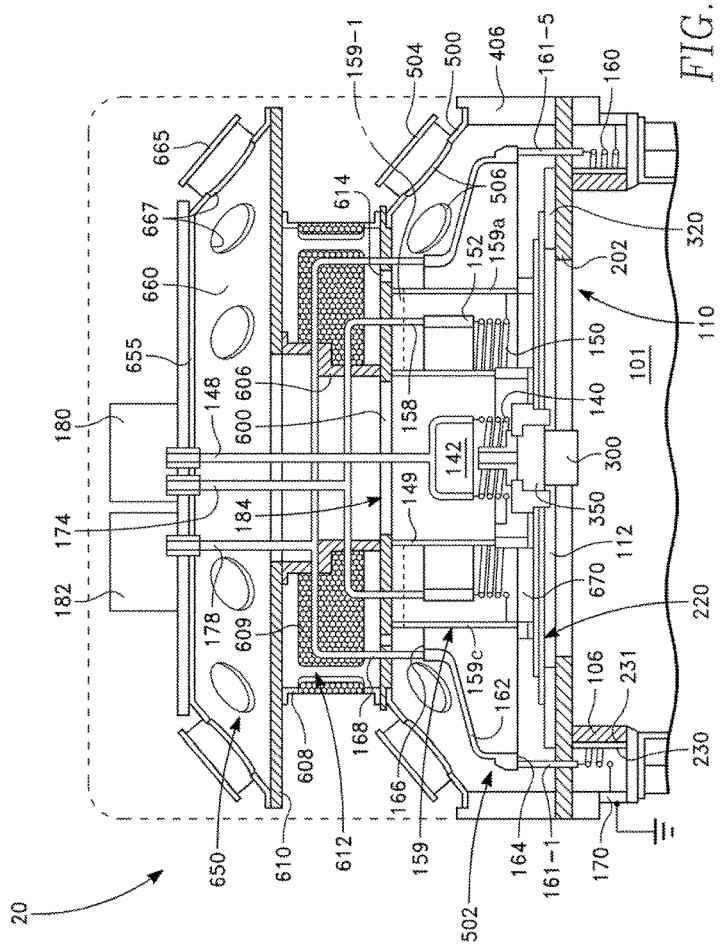
FIG. 1A is an enlarged view of an upper section of the reactor of FIG. 1.
Figure 1B:
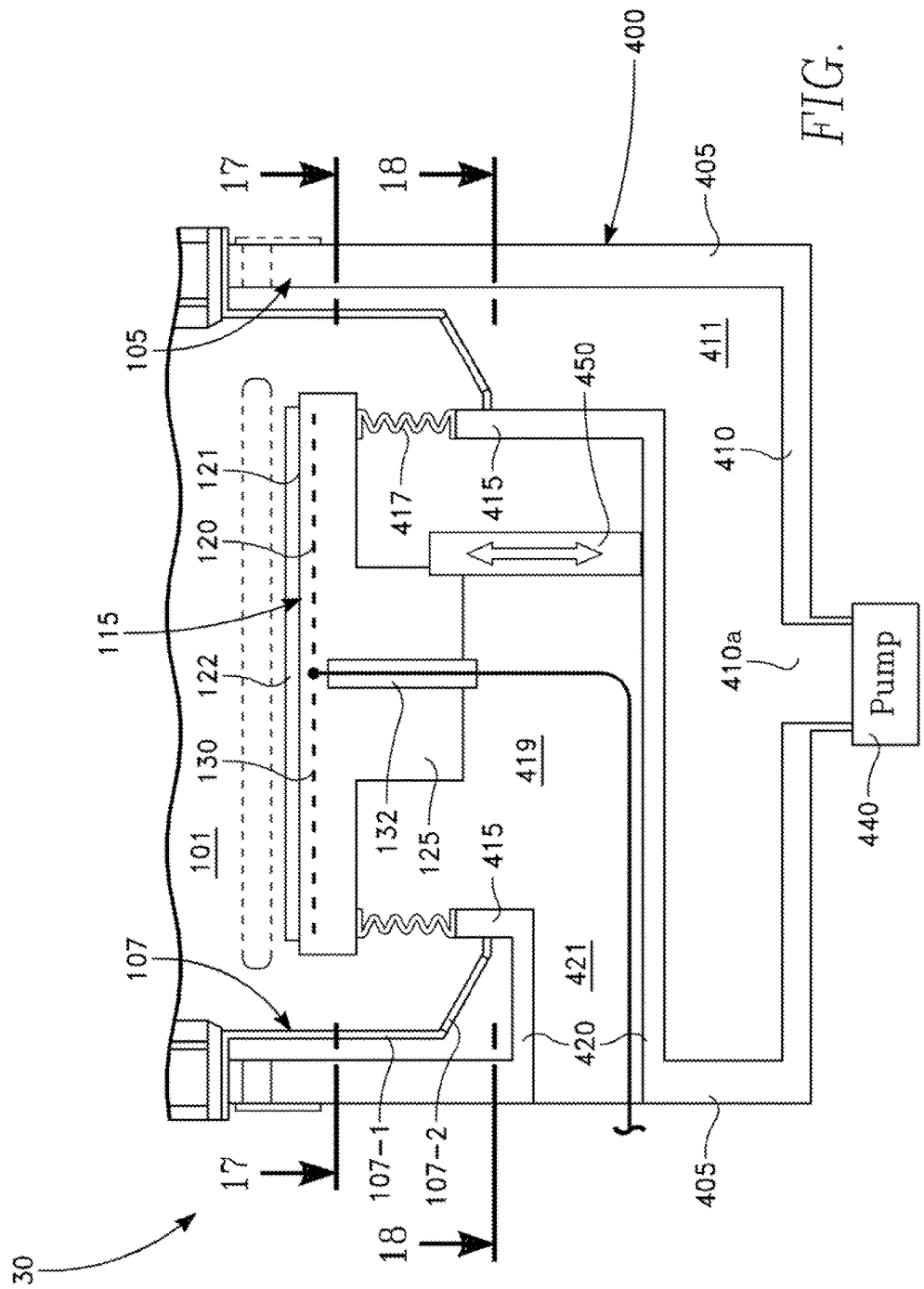
FIG. 1B is an enlarged view of a lower section of the reactor of FIG. 1.

A plasma reactor 10 depicted in FIG. 1 includes an upper portion 20 depicted in the enlarged view of FIG. 1A and a lower portion 30 depicted in the enlarged view of FIG. 1B. Referring to FIGS. 1, 1A and 1B, the plasma reactor 10 includes a plasma processing chamber 100 having a side wall 105 and a lid assembly 110. The side wall 105 has an axially symmetrical shape, such as a cylinder. The side wall 105 includes an axially symmetrical (e.g., cylindrical) dielectric side window 106 and a chamber liner 107, which may be formed of metal. A workpiece support 115 inside the chamber 100 includes a pedestal 120 having a workpiece support surface 121 facing the lid assembly 110 for holding a workpiece 122, and a post 125 supporting the pedestal 120. A processing region 101 of the chamber 100 is confined by the lid assembly 110, the pedestal 120 and the side wall 105. The pedestal 120 may include an insulated internal electrode 130. Optionally, an electrostatic chucking (ESC) voltage and/or RF plasma bias power may be supplied to the internal electrode 130 via a cable 132 extending through the post 125. The cable 132 may be coupled to an RF bias power source (such as an RF impedance match network and/or an RF power generator) as an RF bias feed to the electrode 130. The cable 132 may be provided as a coaxial transmission line, which may be rigid (or flexible), or as a flexible coaxial cable.

Plasma source power is inductively coupled into the processing region 101 by a set of coil antennas, including an inner coil antenna 140, a middle coil antenna 150 and an outer or side coil antenna 160, all of which are concentrically disposed with respect to each other and are coaxial with the axis of symmetry of the side wall 105. The lid assembly 110 includes a disk-shaped dielectric window 112 through which the inner and middle coil antennas 140 and 150 inductively couple RF plasma source power into the processing region 101. The disk-shaped dielectric window 112 is coaxial with the side wall 105 and has a disk-plane parallel with the plane of the workplace support surface 121. The side coil antenna 160 inductively couples RF plasma source power into the processing region 101 through the cylindrical dielectric side window 106.

Figure 2:
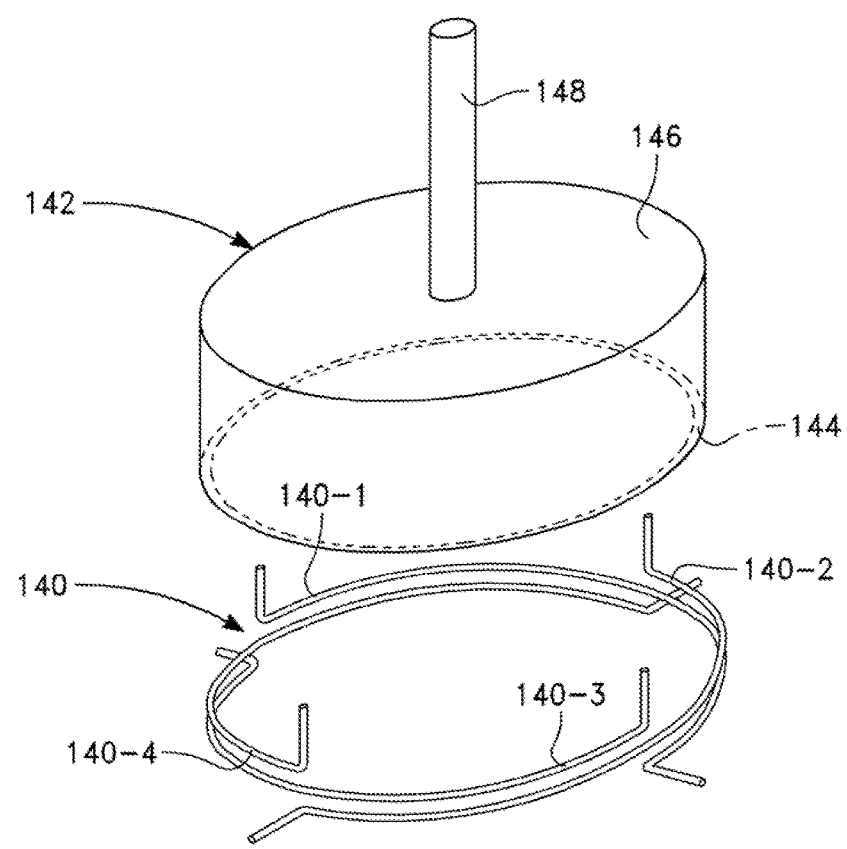
FIG. 2 illustrates an inner zone inductive RF power applicator of the reactor of FIG. 1.

Referring to FIGS. 1A and 2, in one embodiment, the inner coil antenna 140 includes four wire conductors 140-1 through 140-4, each one helically wound about a constant radius along an arc length of 180 degrees, their ends being staggered (i.e., offset along a circumferential direction) at uniformly spaced 90 degree intervals, as depicted in FIG. 2. Uniform and symmetrical distribution of RF power to the wire conductors 140-1 through 140-4 is provided by an RF current distributor in the form of an inverted metal bowl 142 having a circular bottom edge 144 contacting the top ends of each of the wire conductors 140-1 through 140-4, and a lid 146 connected to an inner RF feed rod 148. The bottom ends of the four wire conductors 140-1 through 140-4 are grounded by connection to an inner ground shield 149 (FIG. 1A) in the form of a cylindrical metal sleeve coaxial with the coil antenna 140 and lying between the inner and middle coil antennas 140 and 150. The inner ground shield 149 provides a uniform and symmetrical distribution of ground current from the four wire conductors 140-1 through 140-4, and further provides RF shielding or isolation between the inner and middle coil antennas 140 and 150, by suppressing mutual inductance between them. This enhances independent control of the inner and middle coil antennas 140, 150.

Figure 3:
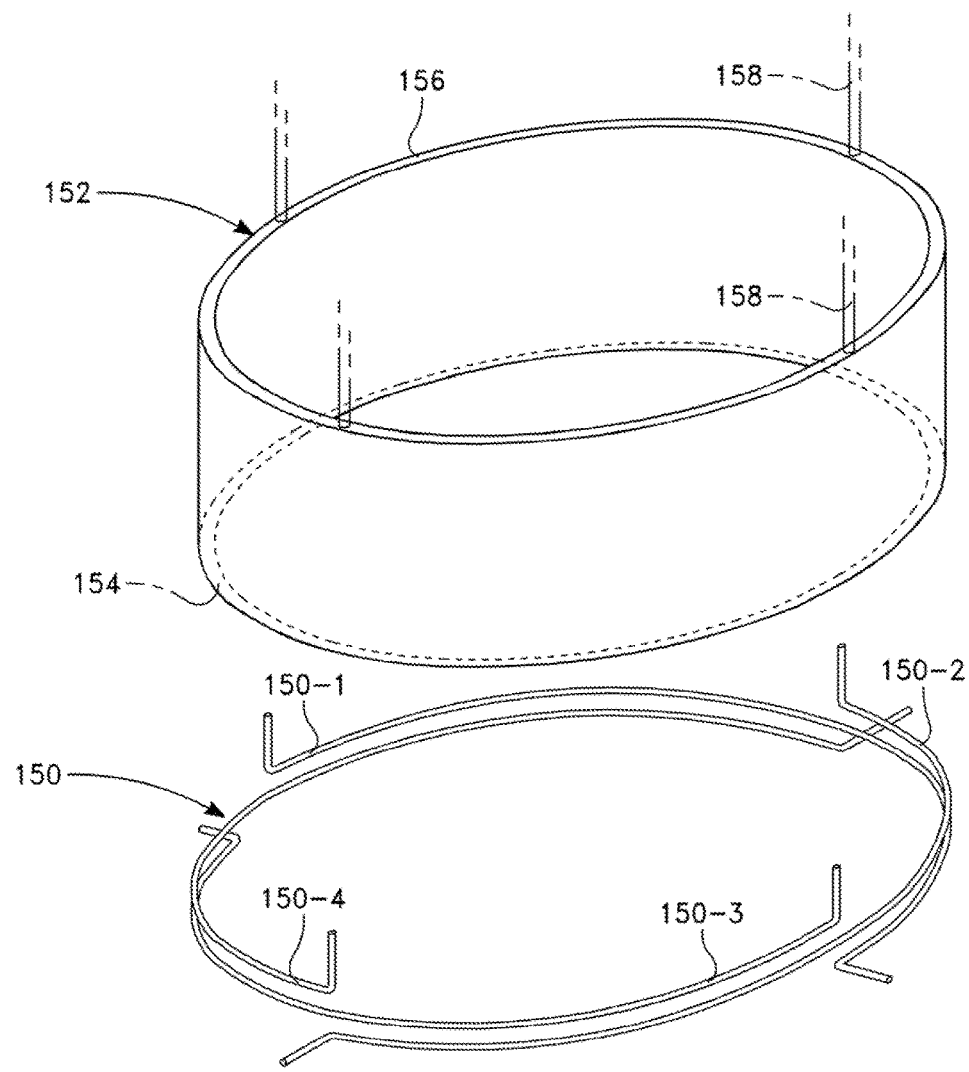
FIG. 3 illustrates an intermediate or middle zone inductive RF power applicator of the reactor of FIG. 1.

Referring to FIGS. 1A and 3, in one embodiment, the middle coil antenna 150 includes four wire conductors 150-1 through 150-4, each one helically wound about a constant radius along an arc length of 180 degrees, their ends being staggered at uniformly spaced 90 degree intervals, as depicted in FIG. 3. Uniform and symmetrical distribution of RF power to the wire conductors 150-1 through 150-4 is provided by an RF current distributor in the form of a cylindrical metal sleeve 152 having a circular bottom edge 154 contacting the top ends of each of the wire conductors 150-1 through 150-4, and a circular top edge 156 connected to a circular array of four axial RF feed rods 158. RF power is fed to the RF feed rods 158 by a conductor structure depicted in FIG. 5, which is described later in this specification.

Referring again to FIG. 1A, the bottom ends of the four wire conductors 150-1 through 150-4 are grounded by connection to a middle ground shield 159. The middle ground shield 159 may be in the form of a cylinder. However, in one embodiment depicted in dashed line in FIG. 1A, the top of the middle ground shield 159 is a metal ring 159-1 coaxial with the coil antenna 150. Four conductive legs 159a through 159d (of which only the legs 159a and 159c can be seen in the view of FIG. 1A) extend axially downward from the ring 159-1 and have bottom ends contacting the bottom ends of the four conductors 150-1 through 150-4. The middle ground shield 159 provides a uniform and symmetrical distribution of ground current from the four wire conductors 150-1 through 150-4.

Figure 4:
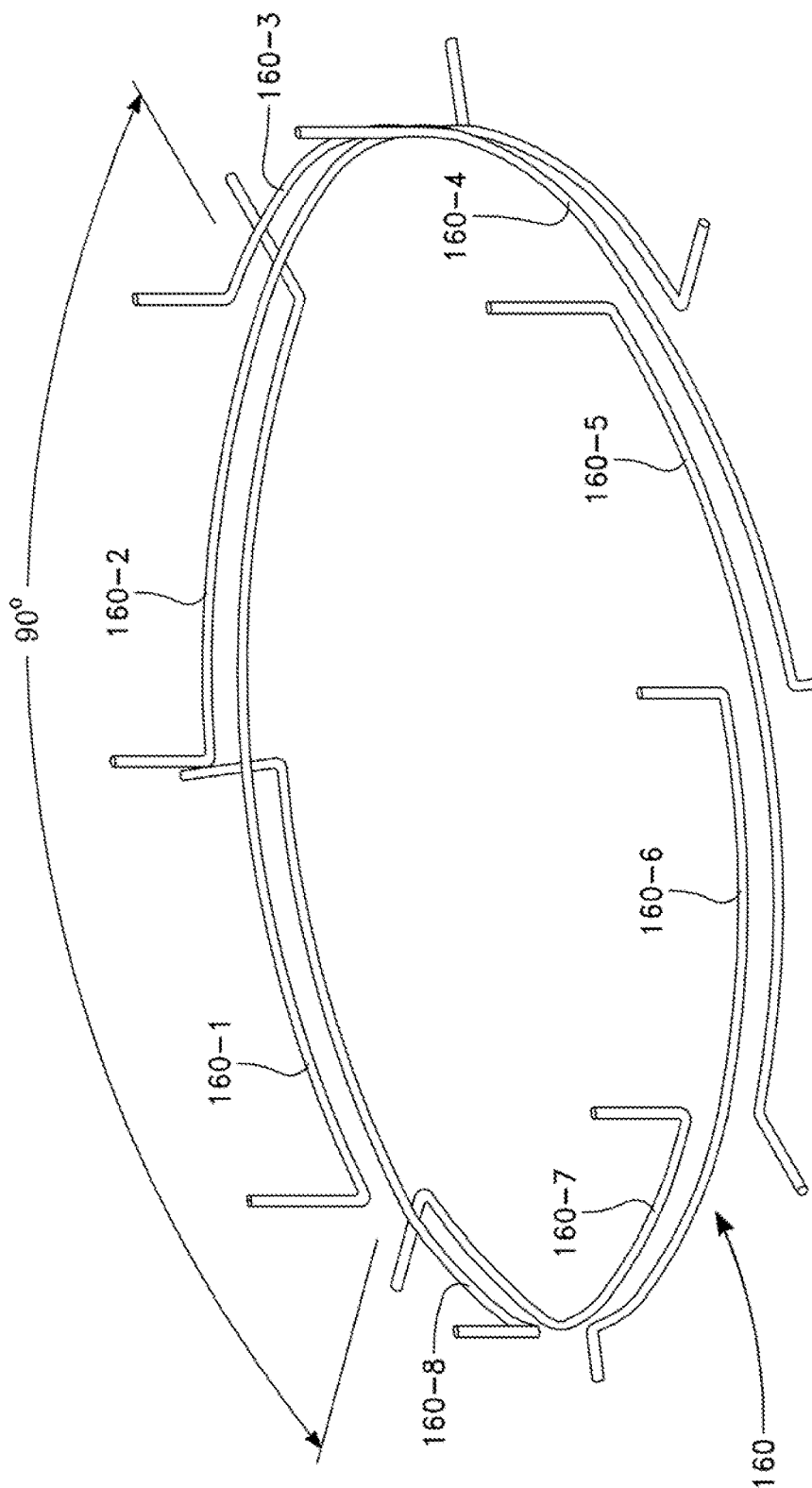
FIG. 4 illustrates an outer zone inductive RF power applicator of the reactor of FIG. 1.

Referring to FIGS. 1A and 4, the side coil antenna 160 is disposed below the plane of the disk shaped dielectric window 112 and surrounds the cylindrical dielectric side window 106. In one embodiment, the side coil antenna 160 includes eight wire conductors 160-1 through 160-8, each one helically wound about a constant radius along an arc length of 90 degrees, their ends being staggered at uniformly spaced 45 degree intervals, as depicted in FIG. 4. Uniform and symmetrical distribution of RF power to the wire conductors 160-1 through 160-8 is provided by an RF current distributor in the form of an inverted metal bowl 162 (FIG. 1A) having a circular bottom edge 164 attached to respective axial conductors 161-1 through 161-8 (of which only the axial conductors 161-1 and 161-5 are visible in the view of FIG. 1A) contacting the top ends of the wire conductors 160-1 through 160-8 respectively. The inverted metal bowl 162 further has a circular top edge 166 connected to a circular array of eight uniformly spaced axial RF feed rods 168. A cylindrical outer chamber wall 170 surrounds the side coil antenna 160 and is grounded. The bottom ends of the eight wire conductors 160-1 through 160-8 are grounded, by connection to the outer chamber wall 170. While the described embodiments include direct connection to ground of the coil antennas 140, 150 and 160 by the ground shields 149 and 159 and the outer chamber wall 170, respectively, the connection to ground may not need to be a direct connection, and instead the connection to ground may be through elements such as capacitors, for example.

Figure 5:
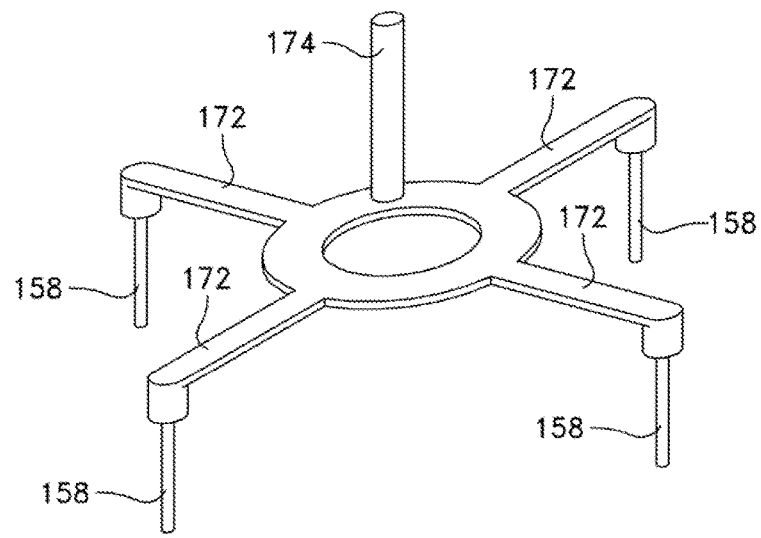
FIG. 5 illustrates a conductive RF power feeder for the RF power applicator of FIG. 3.
Figure 6:
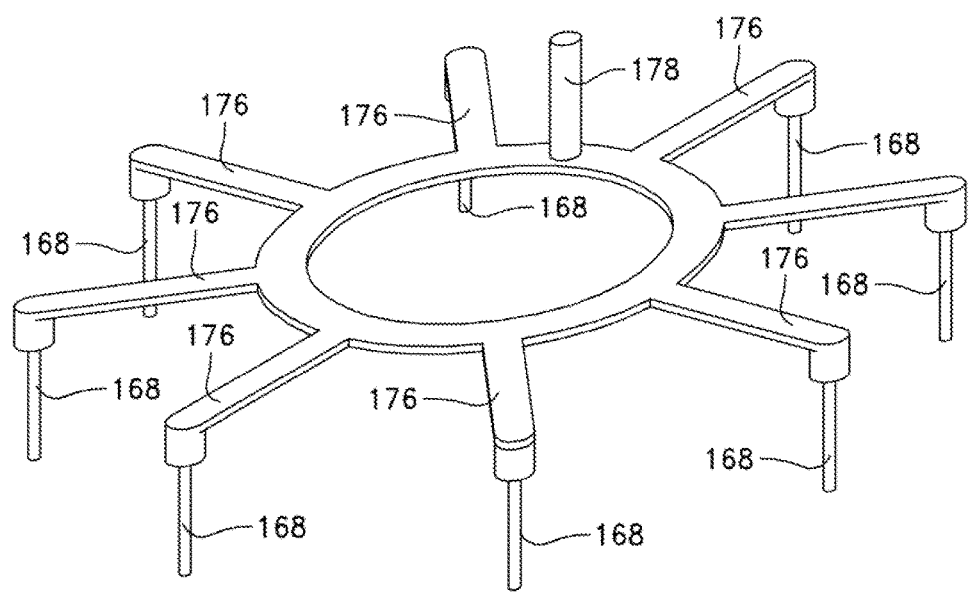
FIG. 6 illustrates a conductive RF power feeder for the RF power applicator of FIG. 4.

Referring to FIG. 5, the four axial RF feed rods 158 associated with the middle coil antenna 150 extend to four radial RF feed rods 172 connected to a common axial feed rod 174. Referring to FIG. 6, the eight axial RF feed rods 168 associated with the side coil antenna 160 extend to eight radial RF feed rods 176 connected to a common axial feed rod 178. The axial RF feed rod 148, the common axial feed rod 174 and the common axial feed rod 178 couple RF power to the respective coil antennas 140, 150 and 160. The power may be supplied from a common RF source or from different RF sources such as RF matches (RF impedance match networks) 180 and 182. As will be described below with reference to FIG. 20B, an RF impedance match network may be employed having dual outputs in order to drive two of the coil antennas with a first RF generator, while a second RF generator and a second RF impedance match network drives the third coil antenna. Alternatively, as will be described below with reference to FIG. 20A, three RF generators may separately drive the three coil antennas through three respective RF impedance match networks. In yet another embodiment, a single RF power generator may drive all three coil antennas through an RF impedance matching network having three outputs. In some implementations of the foregoing embodiments, the RF power levels applied to the different coil antennas may be separately adjusted in order to control radial distribution of plasma ion density. While described embodiments include the three coil antennas 140, 150 and 160, other embodiments may include only one or two of the three described coil antennas 140, 150 and 160.

Only the axial RF feed rod 148 is symmetrically located at the axis of symmetry of the side wall 105, while the axial feed rods 174 and 178 are located off-center, as depicted in FIGS. 1A, 5 and 6. This feature is asymmetrical. The axial RF feed rods 148, 158 and 168 are arrayed symmetrically relative to the axis of symmetry of the side wall 105. A generally disk-shaped conductive ground plate 184 generally parallel with the workpiece support surface 121 contains openings through which the axial RF feed rods 148, 158 and 168 extend. The ground plate 184 provides separation between an upper region containing the non-symmetrically arranged axial feed rods 174 and 178 (and an upper portion of the RF feed rod 148 which is symmetrically located), and a lower region containing only symmetrical features such as the axial RF feed rods 148, 158 and 168. The RF feed rods 148, 158 and 168 are electrically insulated from the ground plate 184. The ground plate 184 electromagnetically shields the processing region 101 from the effects of the asymmetric features above the ground plate 184, and also prevents skew effects in plasma processing of the workpiece 122.

Figure 7:
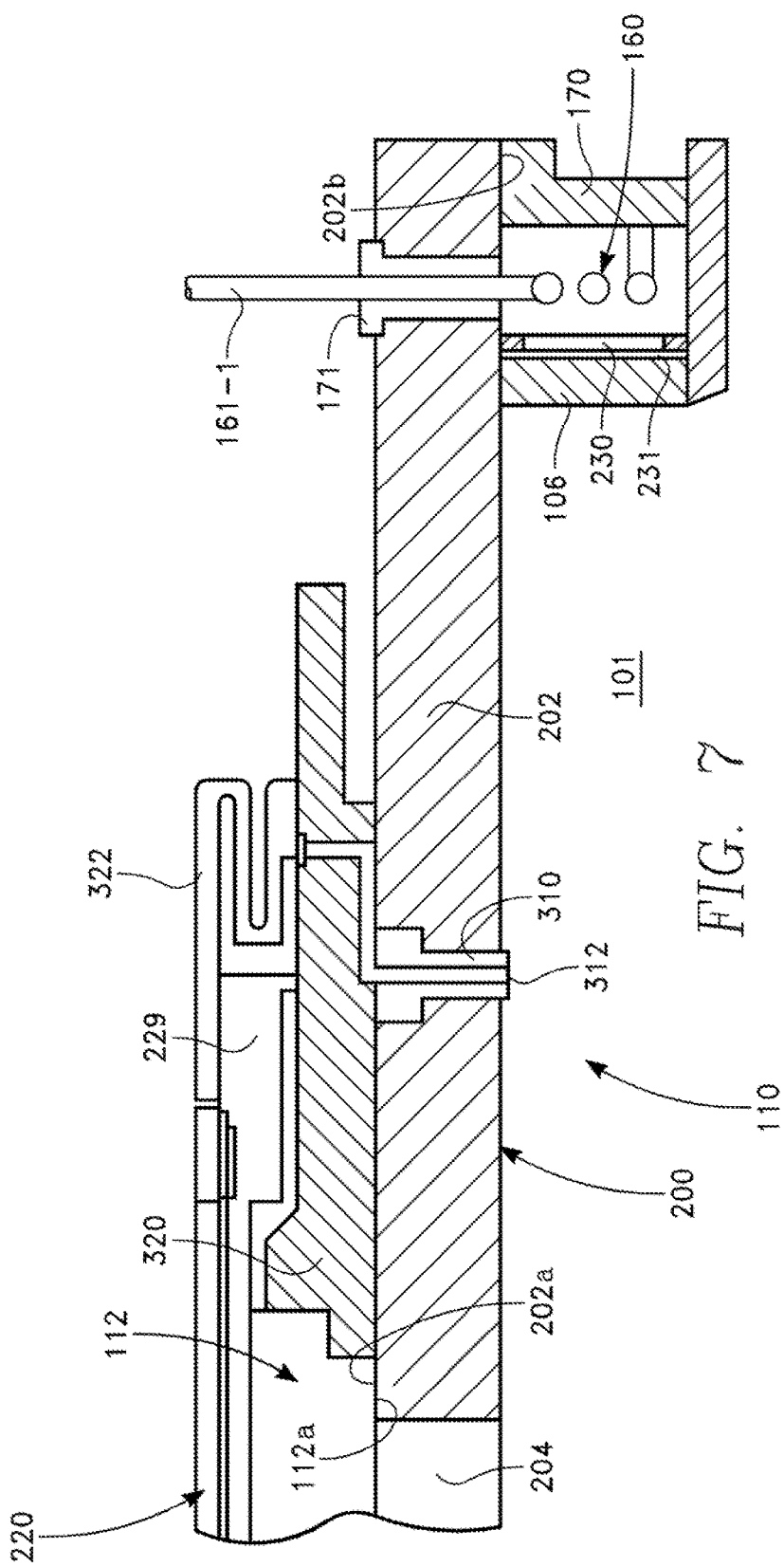
FIG. 7 is a cut-away cross-sectional view of a portion of a lid assembly of the reactor of FIG. 1.

Referring to FIGS. 1 and 7, the disk-shaped dielectric window 112 has a diameter less than the diameter of the outer chamber wall 170. The window 112 is supported at its periphery by an annular top gas plate 200 (described later in this specification) that spans the gap between the outer chamber wall 170 and the window 112, while maintaining the space below the window 112 free of structure that would otherwise inhibit inductive coupling of RF power into the processing region 101. The chamber diameter is therefore not limited by the diameter of the disk-shaped dielectric window 112. The inner and middle coil antennas 140 and 150 (coextensive with the disk-shaped dielectric window 112) may control plasma ion density distribution within an intermediate zone of a diameter smaller than that of the workpiece or wafer 122. Plasma density in an outer zone is governed by the side coil antenna 160 through the cylindrical dielectric window 106. This affords control of plasma ion density distribution across the entire wafer without requiring a concomitant increase in diameter of the disk-shaped dielectric window 112.

As referred to above, the annular top gas plate 200 supports the disk-shaped dielectric window 112 and spans the gap or distance between the outer chamber wall 170 and the periphery of the disk-shaped dielectric window 112. The top gas plate 200 includes an annulus 202 surrounding an opening 204. A top inner edge 202a of the annulus 202 underlies and supports an outer edge 112a of the dielectric window 112 and surrounds the opening 204. A bottom outer edge 202b of the annulus 202 rests on the outer chamber wall 170. The opening 204 faces the disk-shaped dielectric window 112. The axial conductors 161-1 through 161-8 (of the outer coil antenna 160) extend through respective insulators 171 in the top gas plate 200.

Figure 8:
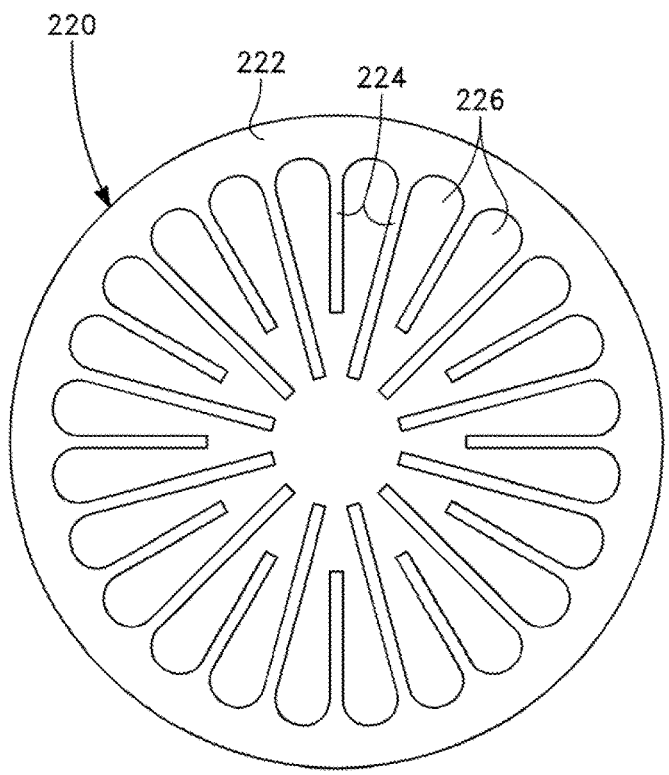
FIG. 8 is a plan view of a heater layer covering a disk-shaped dielectric window of the lid assembly of FIG. 7.

The disk-shaped dielectric window 112 and the cylindrical dielectric side window 106 are heated and nave their respective temperatures controlled independently of one another. They are heated and cooled independently, by cooling from a fan system described later in this specification and by independent heater elements now described. A flat heater layer 220 depicted in FIGS. 1A, 7 and 8 overlies the disk-shaped dielectric window 112. The heater layer 220 is in the form of a disk-shaped Faraday shield, having an outer annulus 222 and plural radial fingers 224 extending radially inwardly from the outer annulus 222, the radial fingers 224 being separated from one another by evenly spaced apertures 226. The spacing of the radial fingers 224 (defining the width of the apertures 226) is sufficient to permit inductive coupling of RF power through the heater layer 220. The heater layer 220 is symmetrical with respect to the axis of the side wall 105. In the illustrated example, there are 24 radial fingers 224, although any suitable number of fingers may be employed. The heater layer 220 is heated electrically by an internal electrically resistive element 229 (FIG. 7) within the heater layer 220.

Figure 9:
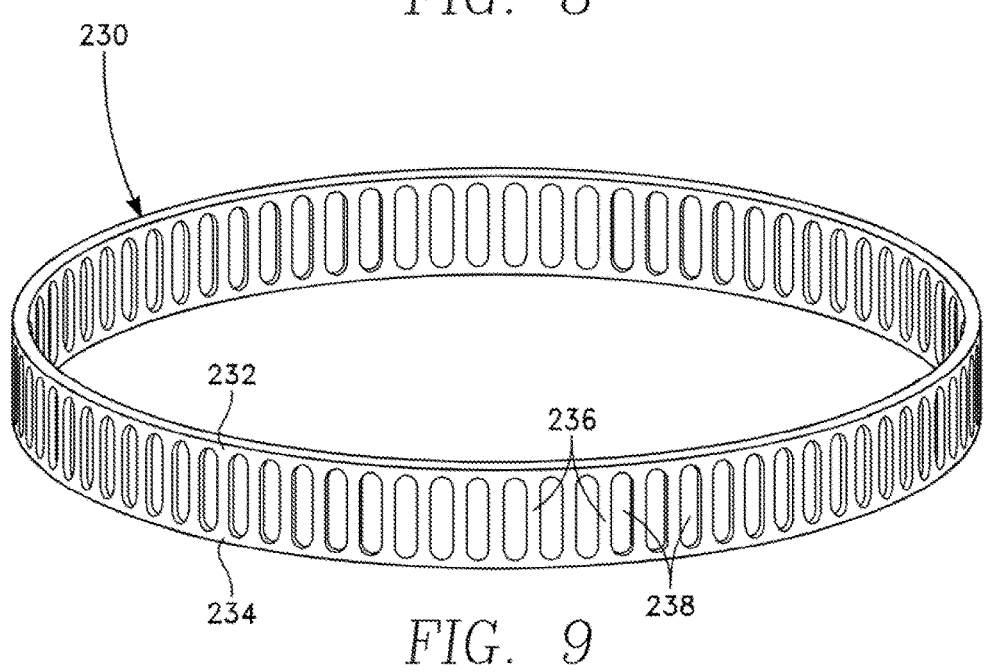
FIG. 9 is an orthographic projection of a heater layer covering a cylindrical dielectric window depicted with the lid assembly of FIG. 7.

A cylindrical Faraday shield layer 230 depicted in FIGS. 1A and 9 is disposed between the cylindrical dielectric window 106 and the outer coil antenna 160, and surrounds the cylindrical dielectric side window 106. The cylindrical Faraday shield layer 230 has upper and lower cylindrical rings 232, 234, and plural axial legs 236 extending axially between the upper and lower cylindrical rings 232, 234 and being separated by evenly spaced gaps 238. The cylindrical Faraday shield layer 230 may be heated electrically by an internal element (such as a heater layer 231 shown in FIGS. 1A and 7) within or contacting with the Faraday shield layer 230.

Process gas is injected into the processing region 101 by a central dual-zone ceiling gas injector 300 (FIG. 1A) and a circular array of peripheral (side) gas injectors 310 (FIG. 7). The ceiling gas injector 300 is located at the center of the disk-shaped dielectric window 112. The peripheral gas injectors 310 are supported on the top gas plate 200 near the side wall 106.

Figure 10:
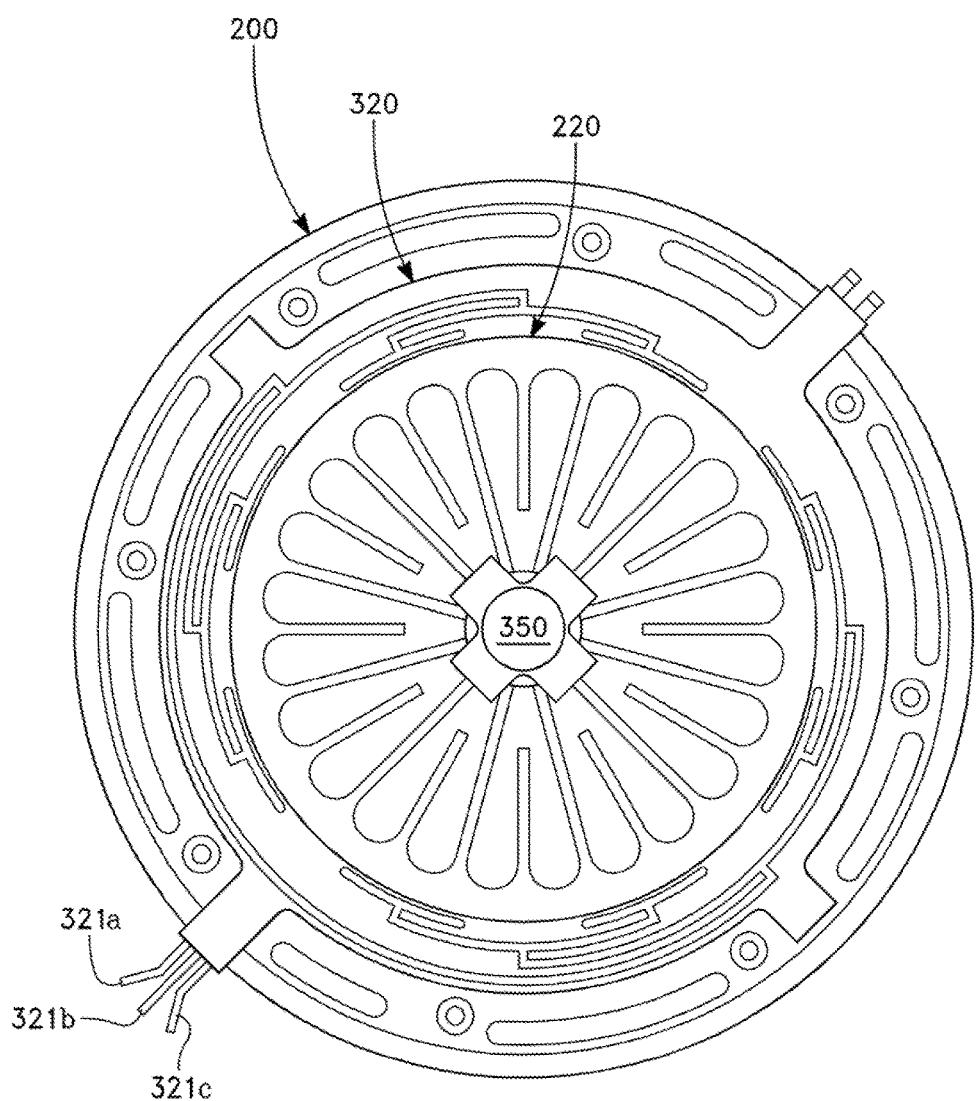
FIG. 10 is a plan view of the lid assembly of FIG. 7.
Figure 11A:
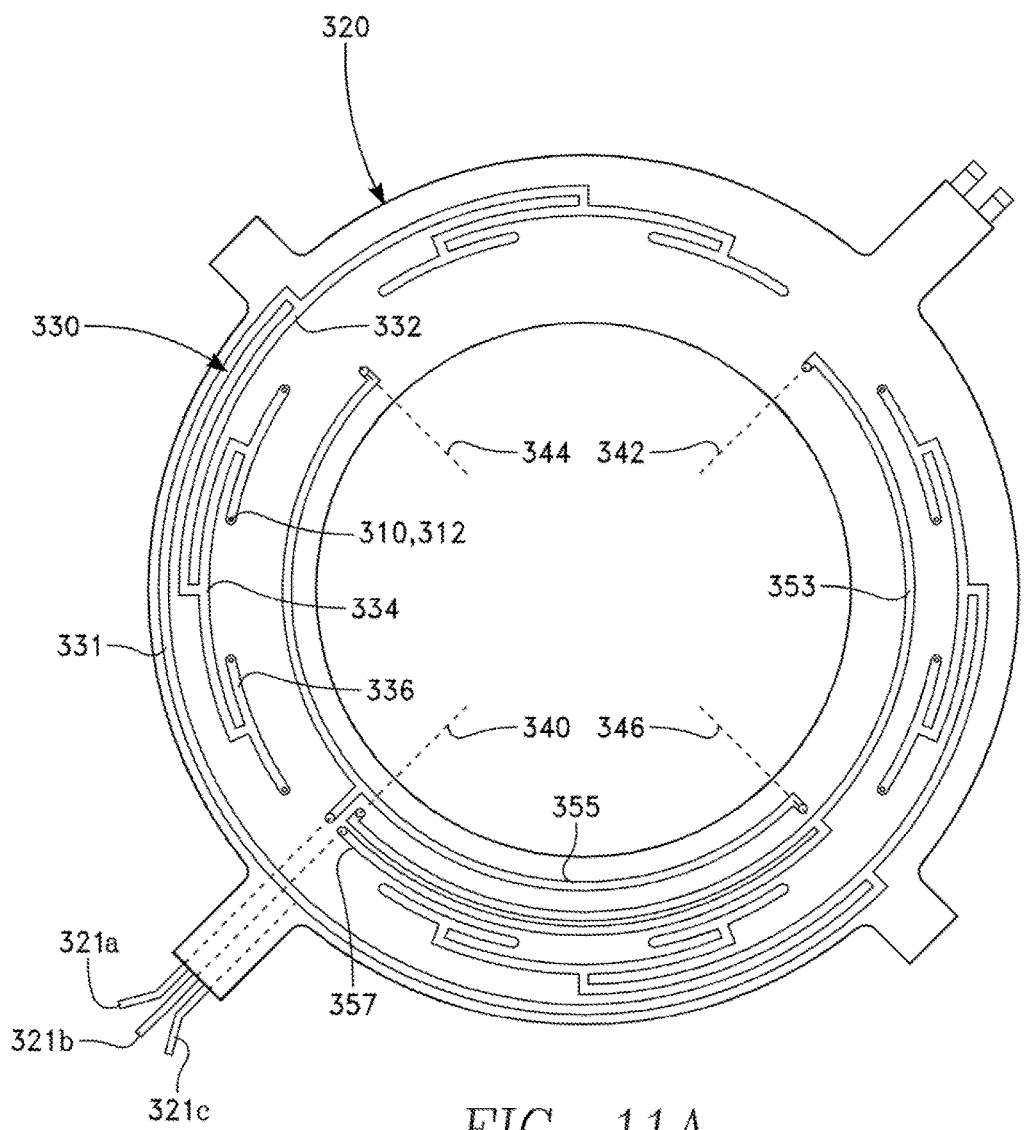
FIG. 11A is a plan view corresponding to FIG. 10 depicting gas flow passages in a gas flow plate of the lid assembly.

Referring to FIGS. 7, 10 and 11A, the lid assembly 110 includes an annular gas flow plate 320. The heater layer or Faraday shield 220 is held on the gas flow plate 320 by a spring plate 322 as shown in FIG. 7. The gas flow plate 320 has three gas input ports 321a, 321b, 321c (FIG. 10). The gas flow plate 320 provides recursive gas flow paths from the input port 321a to a first zone of the dual zone ceiling gas injector 300, recursive gas flow paths from the input port 321b to the other zone of the dual zone gas injector 300, and recursive gas flow paths from the gas input port 321c to the side gas injectors 310. The side gas injectors 310 are fed through respective gas ports 312 in the bottom surface of the gas flow plate 320 visible in the bottom view of FIG. 11B. The recursive gas flow paths provide uniformly distributed gas flow path lengths to different gas injection zones. Uniformity control of the gas distribution can also be enhanced by the recursive gas flow paths.

Referring to FIG. 11A, a first set or hierarchy of recursive gas flow paths 330 in the gas flow plate 320 feeds gas to the side gas injectors 310 through the gas ports 312. The first set of recursive gas flow paths 330 includes a half-circular gas flow path or channel 331. The gas injection port 321c is coupled to the midpoint of the half-circular gas flow channel 331. The gas flow path 331 extends around half a circle and feeds at its ends the midpoints of a pair of arcuate gas flow paths 332 each extending a quarter circle, which in turn feed at their respective ends the midpoints of four arcuate gas flow paths 334 each extending around an eighth circle. The four arcuate gas flow paths 334 feed at their ends the midpoints of eight arcuate gas flow paths 336 each extending around a sixteenth of a circle. The ends of the gas flow paths 336 feed the gas ports 312 for gas flow to the side gas injectors 310.

Figure 12:
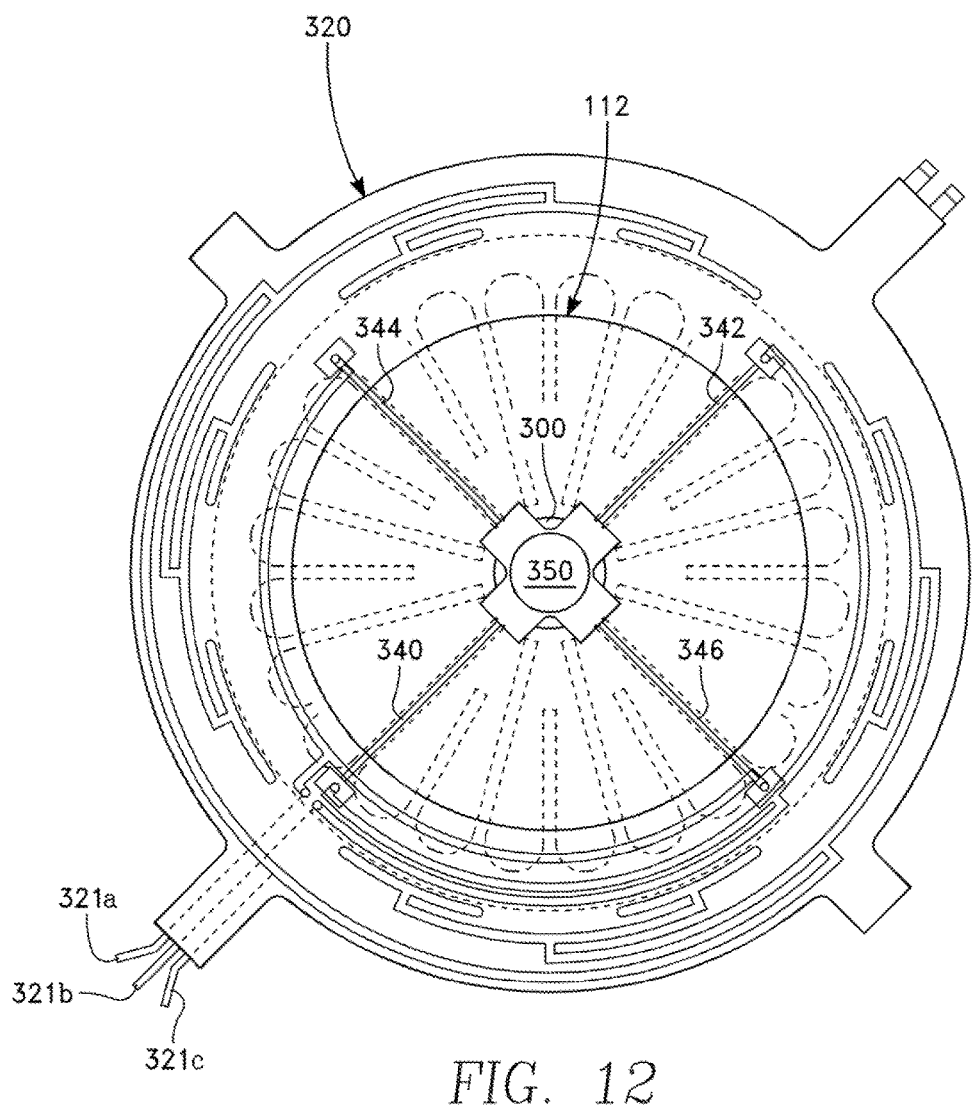
FIG. 12 is a plan view corresponding to FIG. 10 and depicting gas flow paths to a center hub.

Referring to FIG. 12, gas flow to one zone of the dual zone gas injector 300 is carried in a pair of opposing radial gas flow lines 340, 342 overlying the disk-shaped dielectric window 112. Gas flow to the other zone of the dual zone gas injector 300 is carried in a second pair of opposing radial gas flow lines 344, 346 overlying the disk-shaped dielectric window 112 and disposed at right angles to the first pair of radial gas flow lines 340, 342. Connection from the four radial gas flow lines 340, 342, 344, 346 to the dual zone gas injector 300 is provided by a gas flow hub 350 axially coupled to the dual zone gas injector 300.

Referring again to FIG. 11A, a half-circular gas flow channel 353 provides uniform distribution of gas flow from the gas input port 321b to the outer ends of the first pair of radial gas flow lines 340, 342. A quarter-circular gas flow channel 357 provides gas flow from the input port 321b to the midpoint of the half-circular gas flow channel 354. A half-circular gas flow channel 355 provides uniform gas flow from the gas input port 321a to the outer ends of the second pair of radial gas flow lines 344, 346.

Figure 12A:
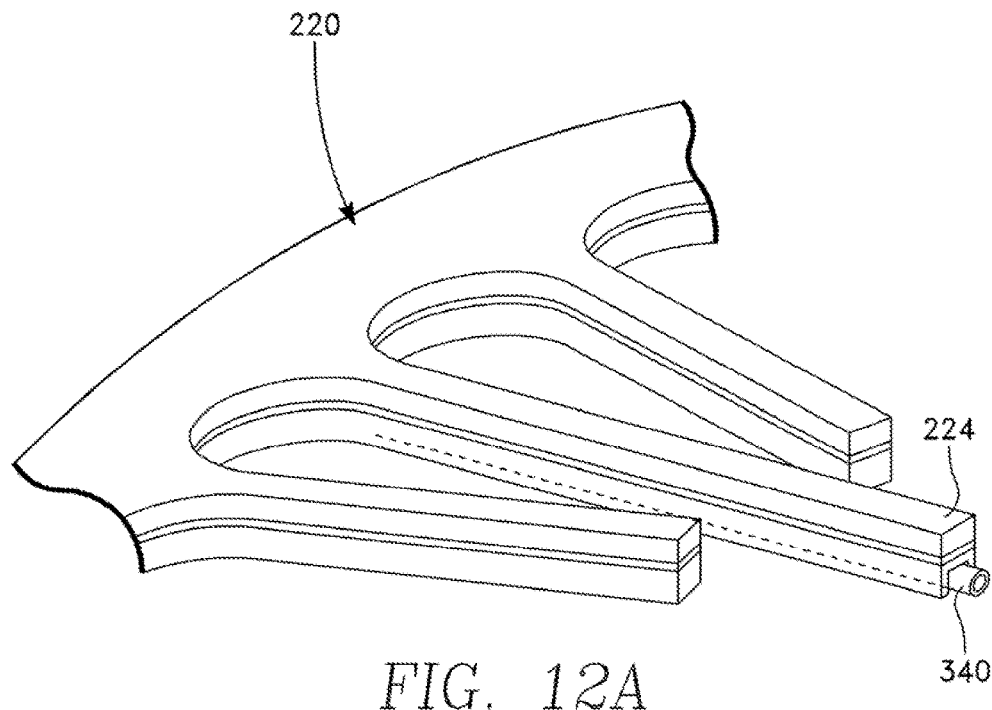
FIG. 12A is an orthographic projection corresponding to a portion of FIG. 12 depicting encasement of a gas flow conduit in a portion of the heater layer of FIG. 8.
Figure 12B:
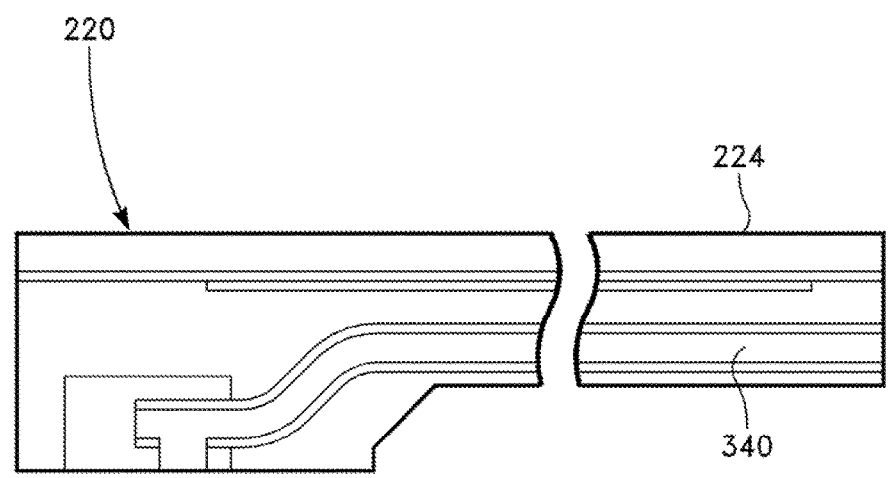
FIG. 12B is a cut-away elevational view corresponding to FIG. 12A.

As depicted in FIGS. 12, 12A and 12B, each of the four radial gas flow lines 340, 342, 344, 346 overlying the disk-shaped dielectric window 112 may be enclosed in a respective one of the radial fingers 224 of the heater layer 220.

Figure 13:
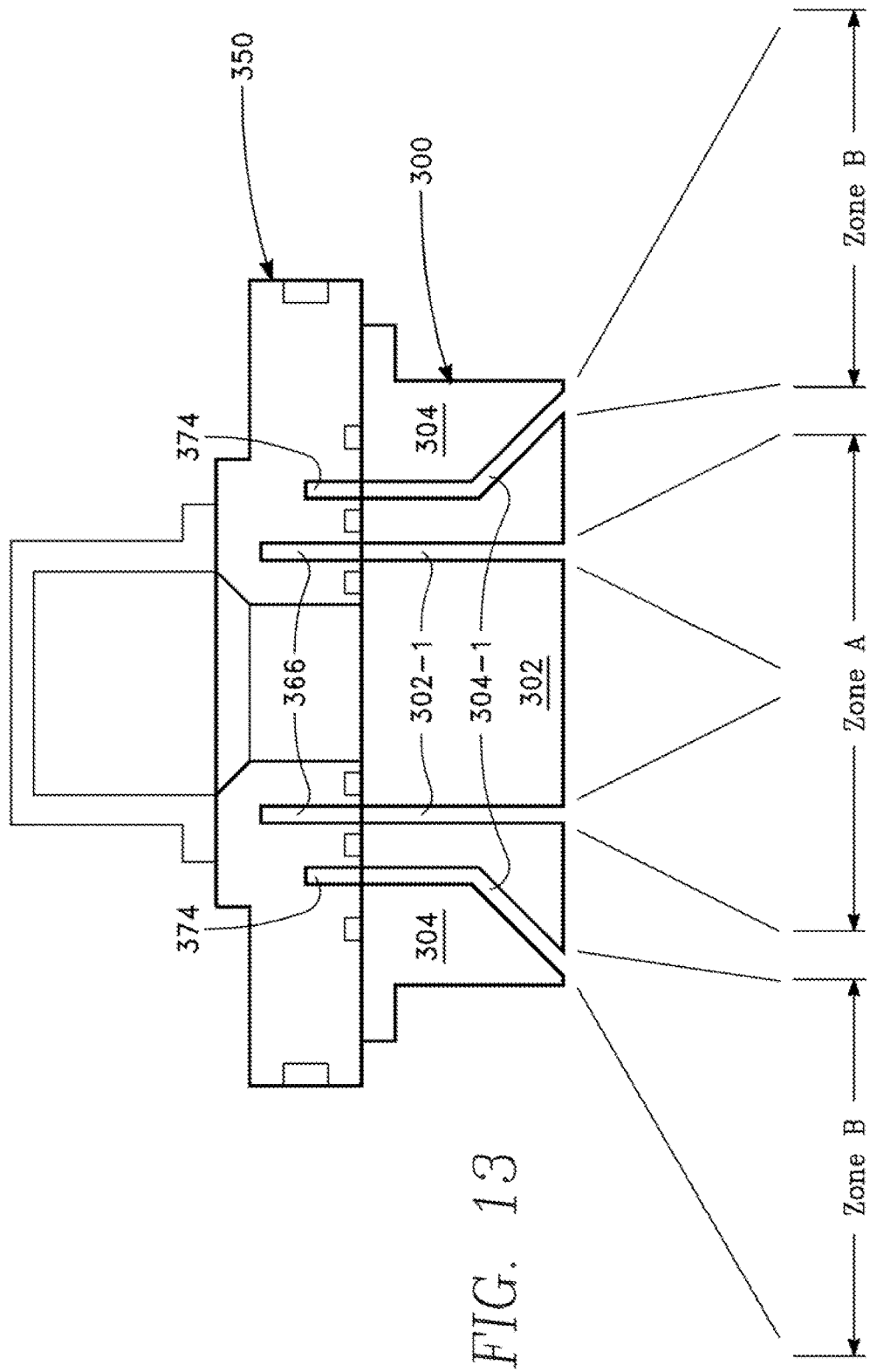
FIG. 13 is an enlarged cut-away view of a center gas disperser of the reactor of FIG. 1.
Figure 14:
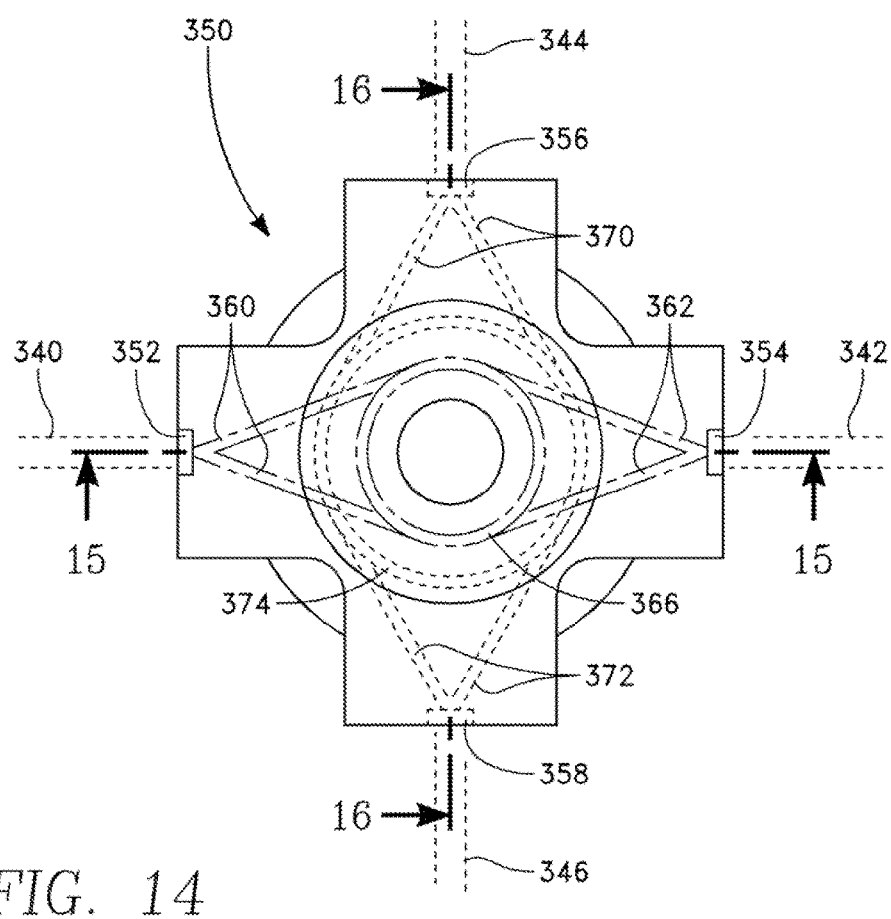
FIG. 14 is a plan view of the center gas disperser of FIG. 13.
Figure 15:
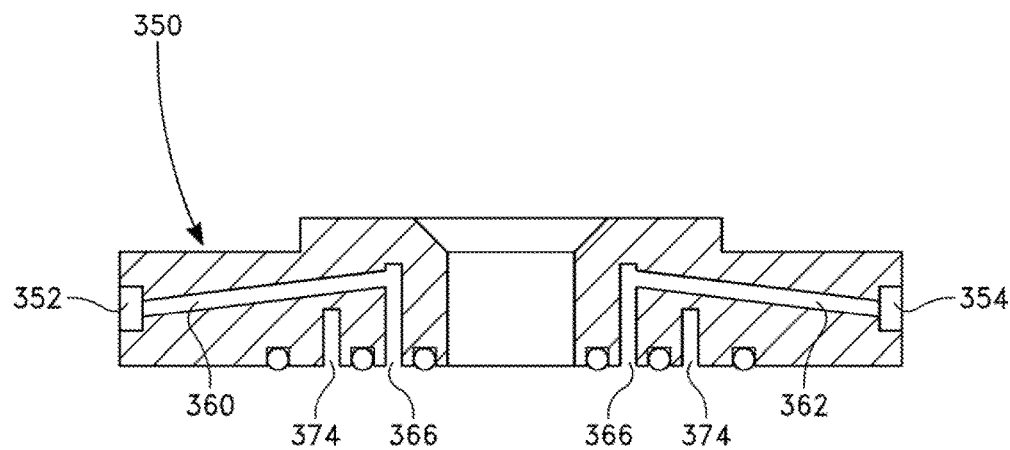
FIG. 15 is a cross-sectional view taken along lines 15-15 of FIG. 14.
Figure 16:
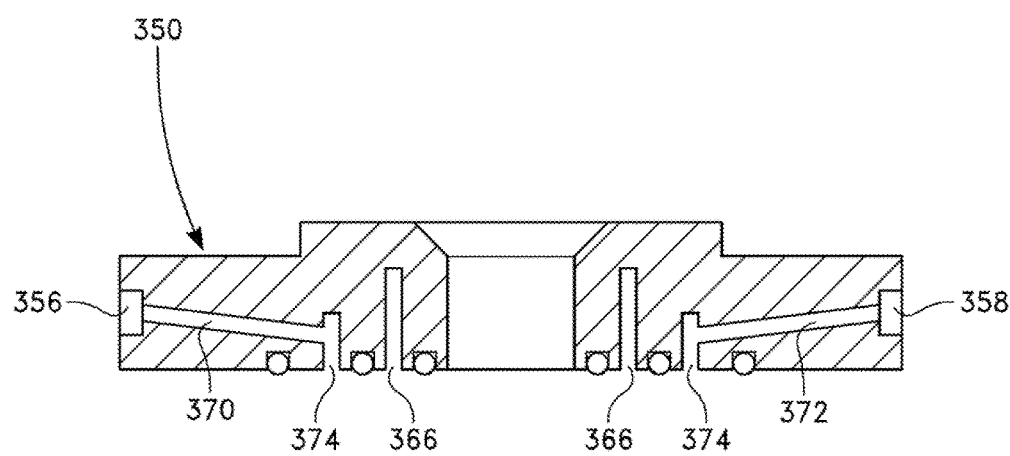
FIG. 16 is a cross-sectional view taken along lines 16-16 of FIG. 14.
Figure 17:
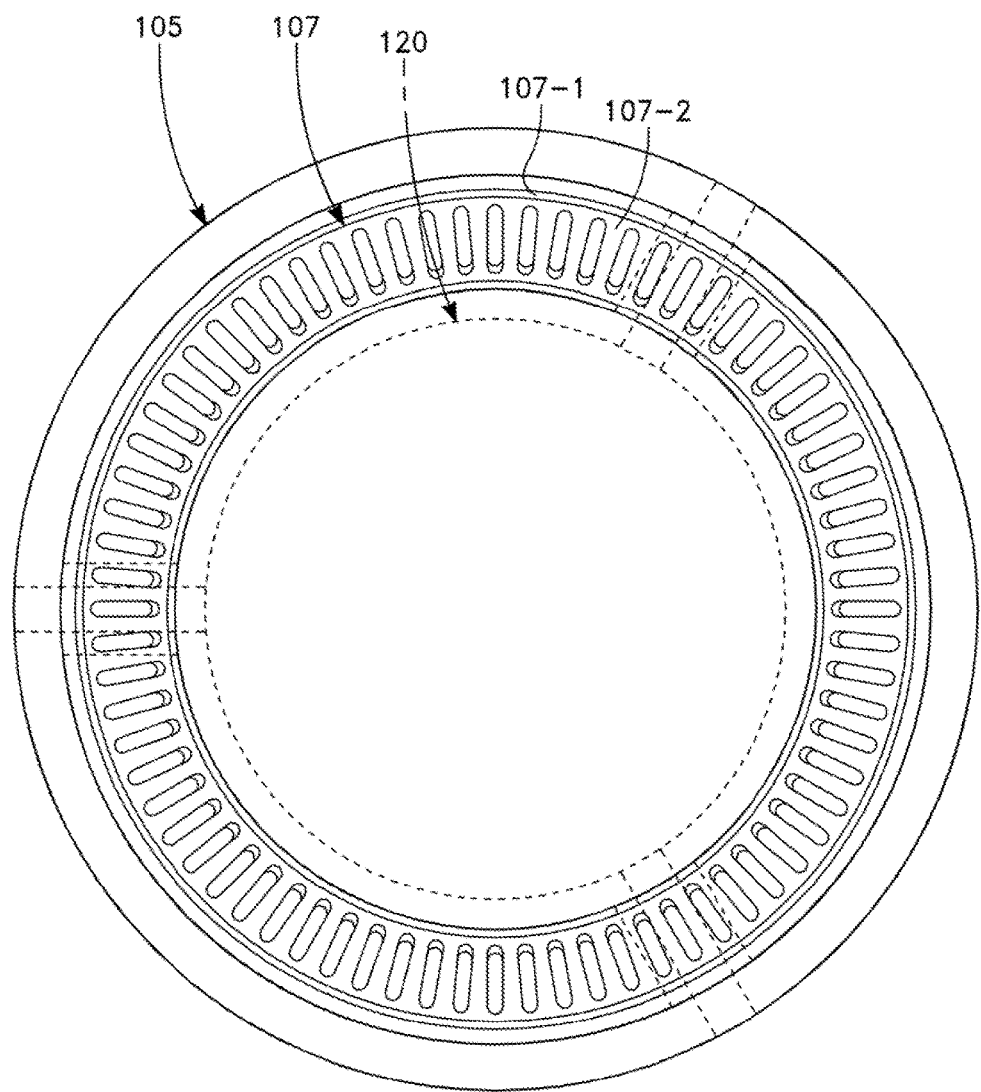
FIG. 17 is a cross-sectional view taken along lines 17-17 of FIG. 1B.
Figure 18:
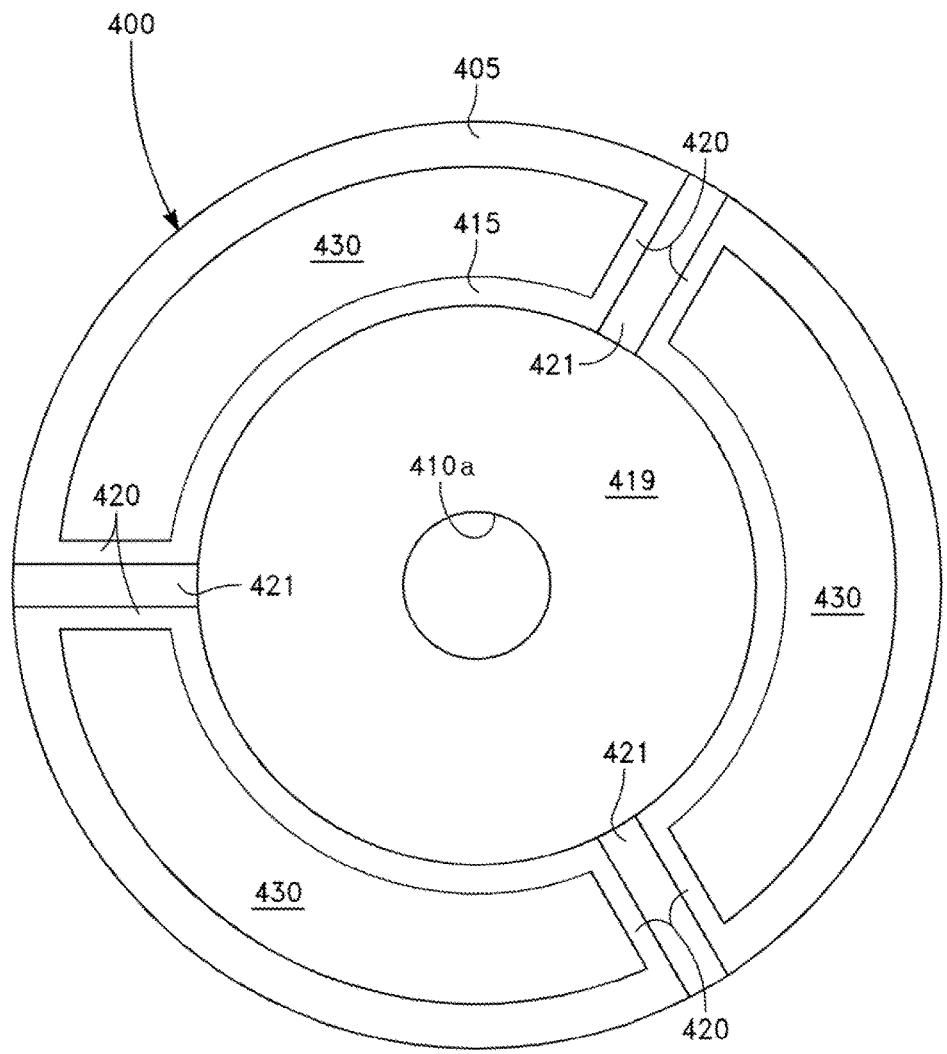
FIG. 18 is a cross-sectional view taken along lines 18-18 of FIG. 1B.

As previously described with reference to FIGS. 1 and 12, the gas flow hub 350 provides coupling between the four radial gas flow lines 340, 342, 344, 346 and the dual zone gas injector 300. One example of the dual zone gas injector 300 is depicted in FIG. 13. The dual zone gas injector 300 of FIG. 13 includes a center gas disperser 302 having an axial inner annular channel 302-1 extending axially and dispersing gas to a radially inner zone A, and a middle gas disperser 304 having a slanted middle annular channel 304-1 dispersing gas to a radially outer zone B. The gas flow hub 350 is now described with reference to FIGS. 13, 14, 15 and 16. The hub 350 has four gas inlet ports 352, 354, 356 and 358 oriented at right angles to one another and connectable to the four radial gas flow lines 340, 342, 344, 346 as indicated in dashed line. The gas inlet ports 352 and 354 feed respective pairs of split gas distribution lines 360, 362, respectively, that terminate at four equally spaced points along a circular inner distribution channel 366 that is in registration with the axial inner annular channel 302-1 of the dual zone gas injector 300. The gas inlet ports 356 and 358 feed respective pairs of split gas distribution lines 370, 372, respectively, that terminate at four equally spaced points along a circular middle distribution channel 374 that is in registration with the axial middle annular channel 304-1 of the dual zone gas injector 300.

Figure 11B:
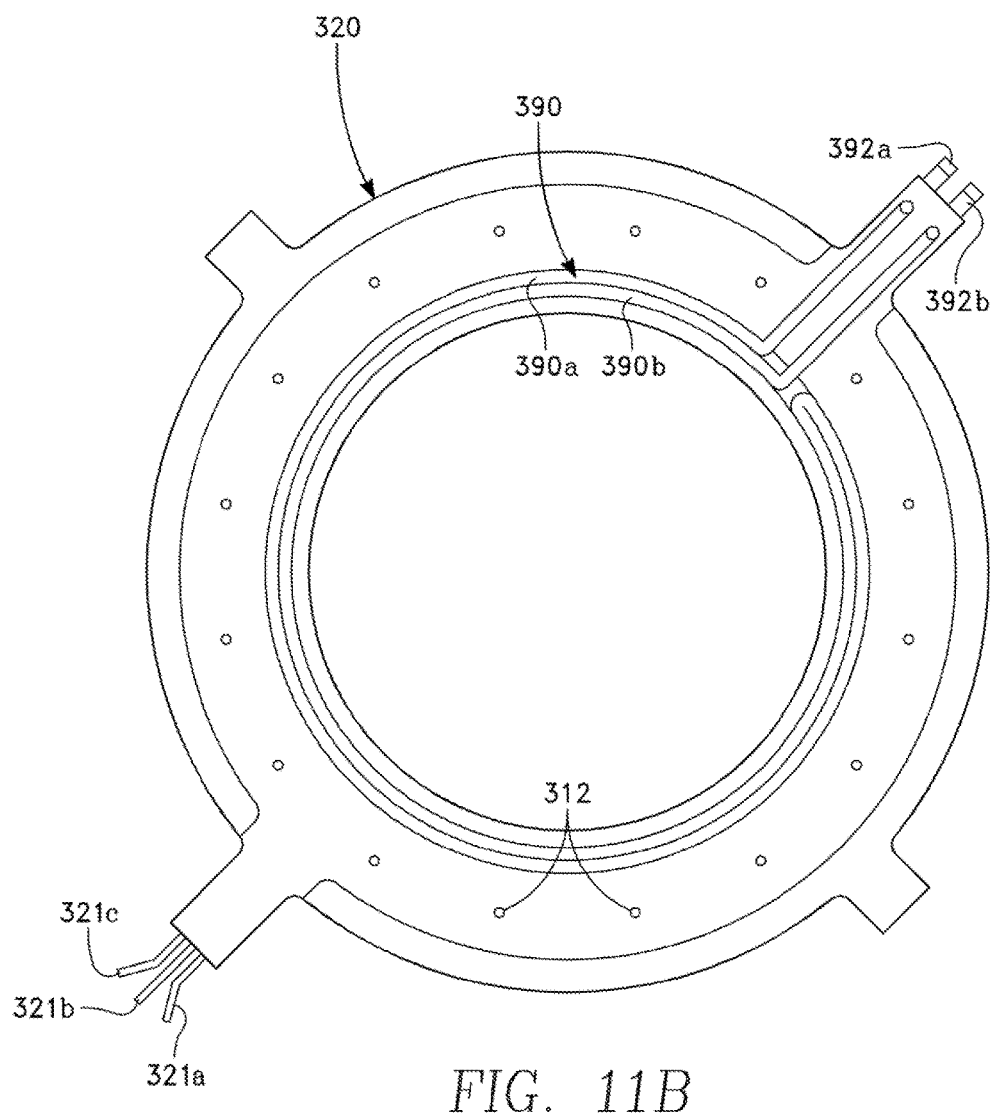
FIG. 11B is a view of an opposite side of the gas flow plate of FIGS. 7 and 11A.

Referring again to the bottom view of FIG. 11B, in one embodiment, optional cooling passages 390 may be provided in the gas flow plate 320, in the form of a circular supply passage 390a and a circular return passage 390b forming a continuous path. External coolant ports 392a and 392b provided connection of the supply and return passages 390a, 390b to an external coolant source (not illustrated in FIG. 11B). Optionally, internal coolant passages may be provided in the outer chamber body wall 170 and fed through a coolant input port.

Referring to FIGS. 1 and 1B, the chamber liner 107 is enclosed within a lower chamber body 400 including a cylindrical lower chamber body side wall 405 and a lower chamber body floor 410. The lower chamber body side wall 405 and the lower chamber body floor 410 enclose an evacuation region 411. The chamber liner 107 includes an upper cylindrical section 107-1 and a lower annular grid 107-2 in the form of an inverted truncated cone. A vacuum pump 440 is disposed in a vacuum pump opening 410a in the floor 410 and is centered relative to the axis of symmetry of the side wall 105. A containment wall 415 coaxial with the workpiece support 115 and a flexible bellows 417 extending between the pedestal 120 and the containment wall 415 enclose the workplace support 115 in an internal central space 419. The central space 419 is isolated from the volume evacuated by the vacuum pump 440, including the evacuation region 411 and the processing region 101. Referring to FIGS. 1B, 17, 18 and 19, there are three hollow radial struts 420 defining radial access passages 421 spaced at 120 degree intervals extending through the chamber body side wall 405 and providing access to the central space 419. Three axial exhaust passages 430 are defined between the three radial struts 420. Different utilities may be provided through different ones of the radial access passages 421, including the RF power cable 132 connected to the electrode 130, heater voltage supply lines connected to heater elements in the workpiece support 115, an electrostatic chucking voltage supply line connected to the electrode 130, coolant supply lines and helium supply lines for backside helium gas channels in the workpiece support surface 121, for example. A workpiece support lift actuator 450 is fixed with respect to the chamber body and moves the workpiece support 115 axially. The workpiece support lift actuator 450 may be used to vary the distance between the workpiece 122 and the lid assembly 110. Varying this distance varies the distribution of plasma ion density. Movement of the lift actuator may be used to improve uniformity of distribution of process (e.g., etch) rate across the surface of the workpiece 122. The lift actuator 450 may be controlled by the user through a programmable controller, for example.

The axially centered exhaust assembly including the vacuum pump opening 410a and the axial exhaust passages 430 avoids asymmetries or skew in processing distribution across the workpiece 122. The annular grid 107-2 masks the processing region 101 from the discontinuities or effects of the radial struts 420. The combination of the axially centered exhaust assembly with the symmetrical distribution of RF current flow below the ground plate 184 minimize skew effects throughout the processing region 101 and enhance process uniformity in the processing region 101.

Figure 19:
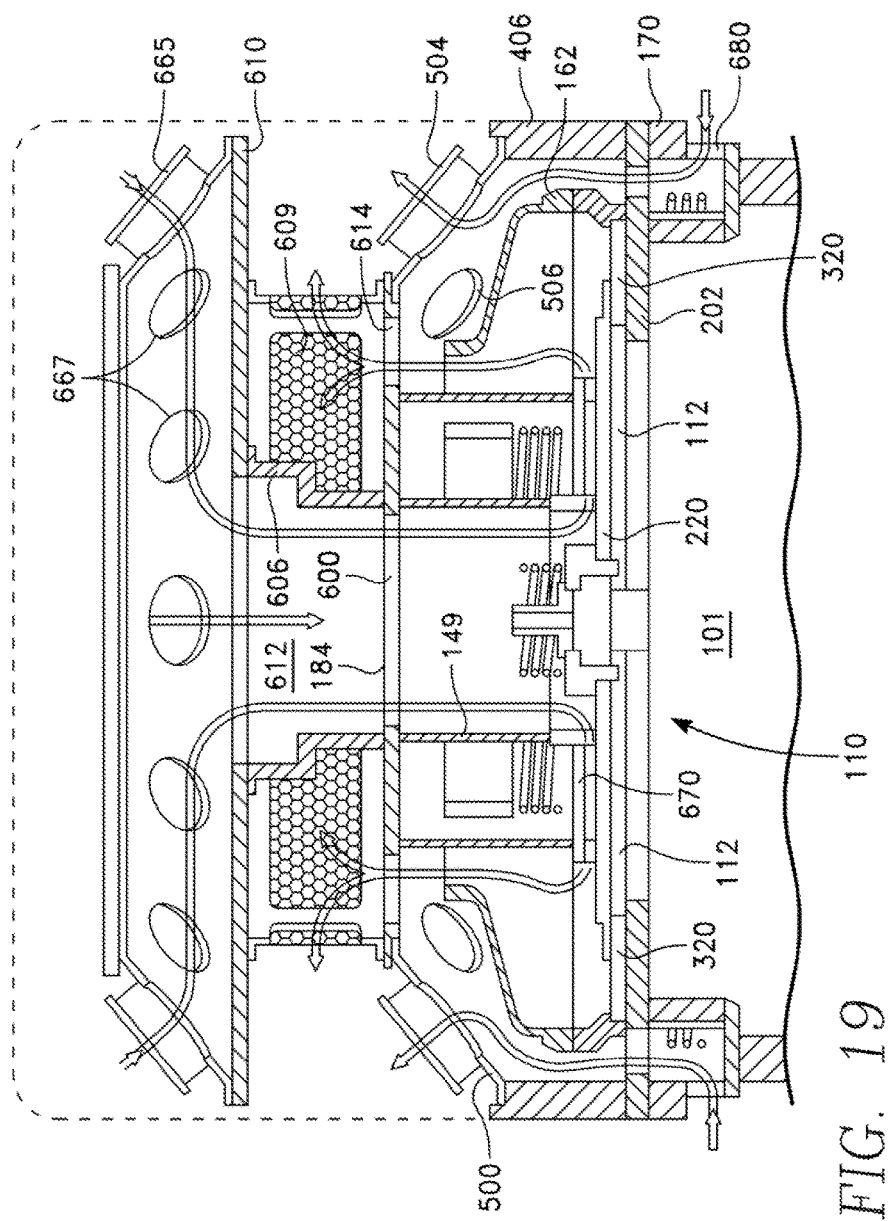
FIG. 19 is a view corresponding to FIG. 1A and depicting cooling air flow paths.

FIG. 19 depicts cooling air flow through the upper section 20 of FIG. 1A. Referring to FIGS. 1A and 19, a chamber body side wall 406 surrounds the lid assembly 110. A lower plenum wall 500 in the form of a truncated cone, for example, is mounted between the top edge of the chamber body side wall 406 and the peripheral edge of the ground plate 184, to enclose a lower plenum 502. A circular array of exhaust fans 504 are mounted in respective openings 506 in the lower plenum wall 500.

The ground plate 184 has a center opening 600 that is co-extensive with the inner ground shield 149. A. cylindrical plenum center wall 606 is coextensive with the center opening 600. A plenum plate 610 overlies the plenum center wall 606. A return chamber 612 is enclosed between a return chamber side wall 608, the plenum plate 610, the ground plate 184 and the center wall 606. The return chamber side wall 608 includes air flow screen sections 609. Openings 614 through the ground plate 184 permit air flow between the lower plenum 502 and the return chamber 612.

An upper plenum 650 is enclosed between a top plate 655 and the plenum plate 610 by an upper plenum side wall 660 in the form of a truncated cone. Plural intake fans 665 are mounted at respective openings 667 in the upper plenum side wall 660.

The intake fans 665 draw air into the upper plenum 650 which flows down through the central opening formed by the center wall 606, the ground plate opening 600 and the middle grounded shield 149. An annular air flow plate 670 overlying the disk-shaped dielectric window 112 confines the air flow between the plate 670 and the window 112. This air may flow through the apertures 226 of the Faraday shield 220 of FIG. 8, for example. Alternatively (or in addition), the air may be confined in a gap 671 between the air flow plate 670 and the window 112. Downward air flow through the cylindrical shield 149 enters the space within the aperture 226 through a central opening of the plate 670 and flows radially outwardly over the disk-shaped dielectric window 112 and enters the lower plenum 502. From the lower plenum 502, the air escapes into the return chamber 612, from which it may exit through the screen sections 609 of the return chamber side wall 608. Thus, the intake fans 665 provide cooling for the disk-shaped dielectric window 112.

The exhaust fans 504 provide cooling for the cylindrical dielectric window 106. The exhaust fans 504 draw air through intake ports 680 in the lower chamber side wall 170 and past the cylindrical dielectric window 106. By operating the intake fans 665 independently from the exhaust fans 504, the different heat loads on the different dielectric windows 106 and 112 may be compensated independently, for accurate temperature control of each window.

Figure 20A:
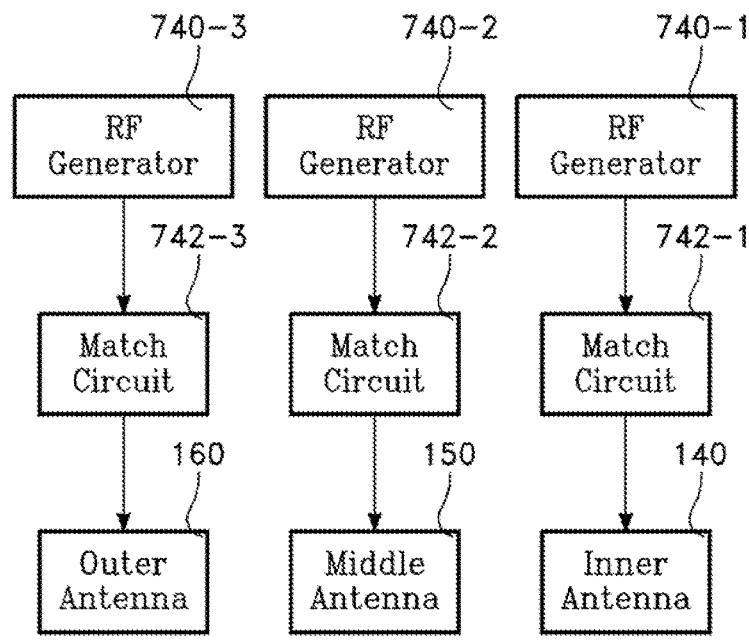
FIGS. 20A and 20B are block diagrams of alternative embodiments of RF power sources for the RF power applicators of FIG. 1A.
Figure 20B:
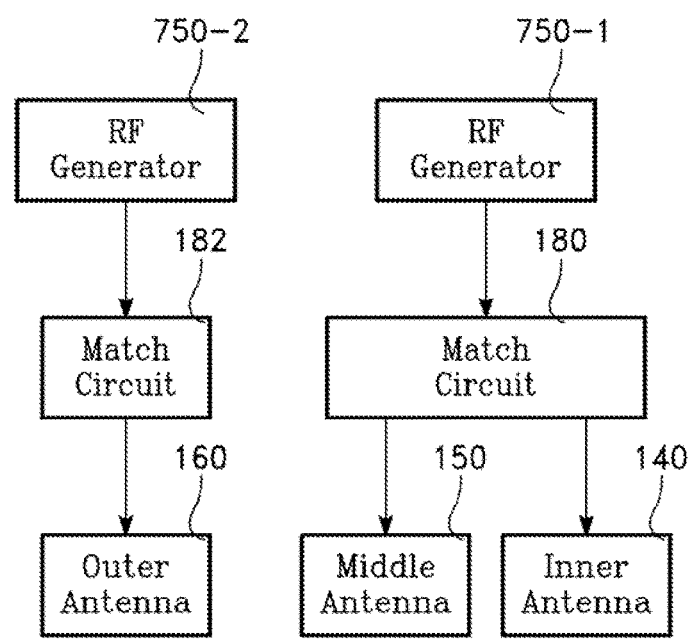

FIG. 20A depicts one embodiment of an RF source for the three coil antennas 140, 150, 160, the RF source having independent RF generators 740-1, 740-2, 740-3, and RF impedance matching networks 742-1, 742-1, 742-3 for the respective coil antennas 140, 150, 160. FIG. 20B depicts an embodiment in which the inner and middle coil antennas 140, 150 are driven from a single RF generator 750-1 through an RF impedance matching network 180 having dual outputs. The dual output RF impedance matching network 180 may facilitate differential control of the power levels applied to the inner and middle coil antennas 140, 150. The outer coil antenna 160 is driven by an RF generator 750-2 through an RF impedance matching network 182. The dual output RF impedance matching network 180 functions as two separate RF power sources, so that there are a total of three RF power sources in the system. In each of the foregoing embodiments, the RF impedance match networks may be disposed on the top plate 655 as depicted in FIG. 1A.

Figure 21:
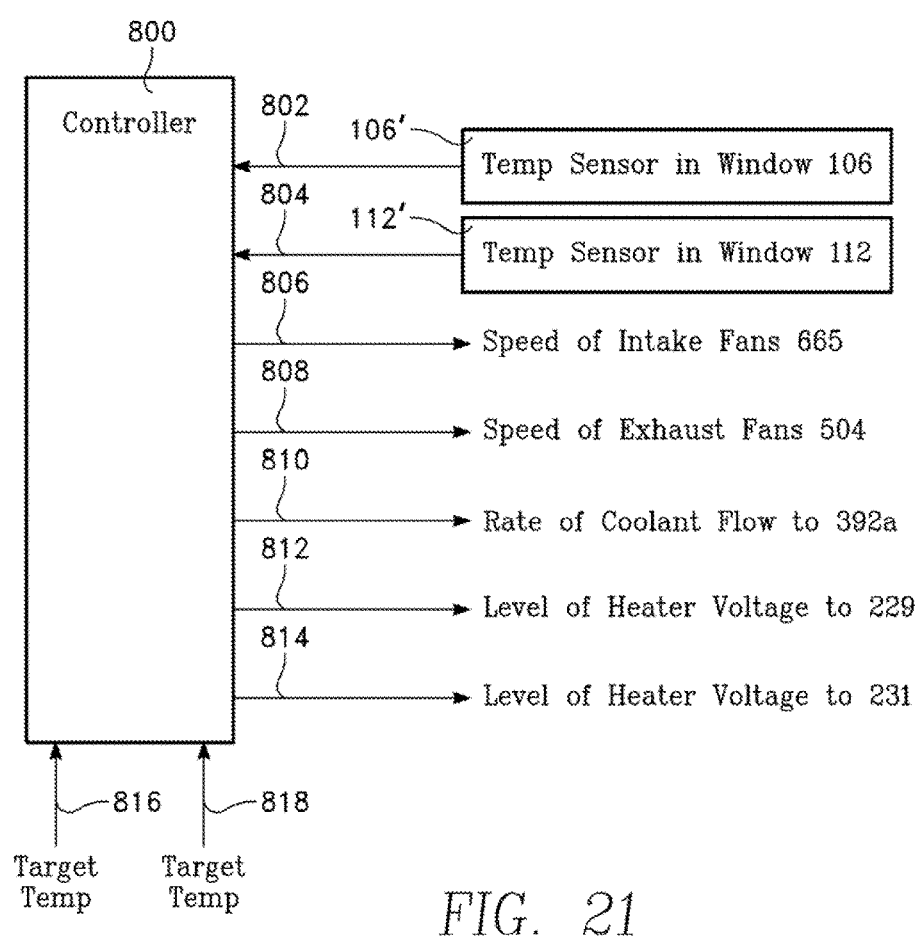
FIG. 21 is a block diagram of a control system controlling the reactor of FIG. 1.

FIG. 21 depicts a control system for controlling the plasma reactor of FIG. 1. The control system is responsive to temperature sensors at different locations within the plasma reactor, such as a temperature sensor 106' at or in the cylindrical dielectric window 106, and a temperature sensor 112' at or in the disk-shaped dielectric window 112. The control system includes a programmable controller 800 which may be implemented as a microprocessor, for example. The controller 800 has an input 802 for receiving the output of the temperature sensor 106' and an input 804 for receiving the output of the temperature sensor 112'. The controller 800 has independent command outputs, including an output 806 governing the speed of the intake fans 665, an output 808 governing the speed of the exhaust fans 504, an output 810 governing the flow rate of coolant to the coolant port 392a in the gas flow plate 320, an output 812 governing the power level to the electric heater 229 near the dielectric window 112, and an output 814 governing the power level to the electric heater 231 at the cylindrical dielectric window 106.

The controller 800 in one embodiment is programmed to govern the outputs 808-814 in response to the inputs 802, 804 to maintain the windows 106, 112 at respective target temperatures that may be furnished by a user to controller inputs 816 and 818. The controller 800 may be programmed to operate in the manner of a feedback control loop to minimize the difference between the user input 816 and the sensor input 802, and to minimize the difference between the user input 818 and the sensor input 804.

As described above, some of the advantageous effects of various ones of the foregoing embodiments include symmetrical distribution of RF power to the coil antennas for enhanced plasma distribution symmetry. Shielding of the coils from asymmetrical RF current feed structures reduces skew effects in plasma distribution. Shielding of the coil antennas from one another enhances independent control of the coil antennas, for superior control of plasma density distribution. Symmetrical chamber exhaust in combination with the symmetrical coil antennas provides a high density plasma source with symmetrical plasma distribution. Separate dielectric windows for different RF coils enables independent thermal control of the different dielectric windows. Separately supporting the different dielectric windows at or over the processing region enables the chamber diameter to be increased beyond the diameter of each individual dielectric window, facilitating a large increase in chamber diameter. The moveable workpiece support electrode in combination with symmetrical coil antenna(s) allows superior control over center-to-edge plasma density distribution with a minimized asymmetrical non-uniformity component. The moveable workpiece support electrode in combination with symmetrical coil antenna(s) and in further combination with the symmetrical chamber exhaust allows even better control over center-to-edge plasma density distribution with minimized asymmetrical non-uniform component.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
an enclosure having an axis of symmetry and a workpiece support within the enclosure, said workpiece support and said enclosure defining a processing region;
said enclosure comprising a metallic portion and a dielectric portion comprising plural dielectric windows supported on said metallic portion, each of said dielectric windows extending around said axis of symmetry, said enclosure having a diameter greater than the diameter of at least one of said dielectric windows, a first one of said dielectric windows comprising a disk-shaped dielectric window and a second one of said dielectric windows comprising a cylindrical dielectric window;
plural concentric coil antennas disposed on an external side of said enclosure, respective ones of said coil antennas facing respective ones of said dielectric windows;
a cylindrical chamber body wall surrounding said cylindrical dielectric window;
an annular top gas plate comprising a peripheral portion supported on said chamber body wall, and a central opening through said annular top gas plate, wherein said disk-shaped dielectric window comprises a circular edge portion supported on an edge of said central opening;
a center gas disperser at a center of said disk-shaped dielectric window having a pair of opposing input ports and disposed to introduce gas into said processing region; and
at least a pair of opposing gas flow conduits extending radially across said disk-shaped dielectric window to said opposing input ports of said center gas disperser;
wherein first and second ones of said coil antennas are concentrically disposed over said disk-shaped dielectric window, and a third one of said coil antennas has a diameter exceeding a diameter of said cylindrical dielectric window and surrounds said cylindrical dielectric window;

said reactor further comprising a first heater layer on said disk-shaped dielectric window and comprising a radially outer portion and plural fingers extending radially inwardly from said radially outer portion; and wherein said pair of opposing gas flow conduits are enclosed in respective ones of said plural fingers of first heater layer.

2. The plasma reactor of claim 1 wherein:

said enclosure has a diameter greater than the diameter of said disk-shaped dielectric window.

3. The plasma reactor of claim 1 wherein said cylindrical dielectric window is below a plane of said disk-shaped dielectric window.

4. The plasma reactor of claim 1 wherein said disk-shaped dielectric window has a diameter less than the diameter of said chamber body wall, and a gap separates said chamber body wall from said disk-shaped dielectric window, said peripheral portion of said top gas plate spanning said gap, and said disk-shaped dielectric window is suspended over said central opening of said top gas plate.

5. The plasma reactor of claim 1 wherein said top gas plate comprises:

plural gas supply ports;

plural gas injection orifices circularly arranged about said peripheral portion;

a first hierarchy of equal length recursive gas flow paths from a first one of said gas supply ports to said plural gas injection orifices.

6. The plasma reactor of claim 5 wherein said top gas plate further comprises:

a second hierarchy of equal length recursive gas flow paths from a second one of said gas supply ports to said pair of gas flow conduits.

7. The plasma reactor of claim 1 further comprising a second heater layer on said cylindrical dielectric window, said second heater layer comprising a grid of axial fingers.

8. The plasma reactor of claim 7 further comprising:

a cylindrical shield coaxial with an axis of symmetry and located between said first and second ones of said coil antennas and facing an inner radial portion of said disk-shaped dielectric window;

a top fan plenum in a central air flow path comprising an axial path passing through an interior of said cylindrical shield and a radial path extending across a surface of said disk-shaped dielectric window, and plural intake fans coupled to said top fan plenum.

9. The plasma reactor of claim 8 further comprising an annular air flow plate overlying said disk-shaped dielectric window and having a center air flow aperture open to said interior of said cylindrical shield and forming a top boundary of said radial path of said central air flow path.

10. The plasma reactor of claim 9 wherein said annular air flow plate confines said radial path to regions between said plural fingers of said first heater layer.

11. The plasma reactor of claim 8 wherein a side air flow passage is defined between said cylindrical dielectric window and said cylindrical chamber body wall, said plasma reactor further comprising:

a side fan plenum at an axial location between the top fan plenum and the cylindrical dielectric window, said side fan plenum open to said side air flow passage and comprising plural side fan plenum openings;

plural exhaust fans at said plural side fan plenum openings.

12. The plasma reactor of claim 11 further comprising:

a first temperature sensor at said disk-shaped dielectric window;

a second temperature sensor at said cylindrical dielectric window;

a controller coupled to said first and second temperature sensors, said controller being coupled to govern levels of power delivered respectively to said first heater layer, said second heater layer, said plural intake fans, said plural exhaust fans, and to respective ones of said coil antennas.

13. The plasma reactor of claim 12 wherein:

said controller is programmed to control the power levels delivered to said first heater layer and said plural intake fans in response to an output of said first temperature sensor; and said controller is programmed to control the power levels delivered to said second heater layer and said plural exhaust fans in response to an output of said second temperature sensor.

14. The plasma reactor of claim 8 further comprising:

an RF power feed assembly coupled to said plural coil antennas and comprising plural conductive legs;

a ground plate extending radially and having openings through which respective ones of said legs extend, said ground plate providing a boundary between an upper region in which at least some of said plural conductive legs are distributed asymmetrically and a lower region in which said respective ones said legs are distributed symmetrically with respect to said axis of symmetry;

wherein said ground plate comprises a circular center aperture aligned with said axial path of said central air flow path.

15. The plasma reactor of claim 1 further comprising an exhaust chamber assembly, said exhaust chamber assembly comprising:

an exhaust chamber wall defining an evacuation region at a side of said workpiece support opposite said processing region, said exhaust chamber assembly having an exhaust pump port symmetrically located relative to an axis of symmetry; and plural axial exhaust passages between said processing region and said evacuation region, and symmetrically distributed with respect to said axis of symmetry.

* * * * *

UNITED STATES PATENT AND TRADEMARK OFFICE
CERTIFICATE OF CORRECTION

| | | |
|---|---|---|
| PATENT NO. | : 9,896,769 B2 | Page 1 of 1 |
| APPLICATION NO. | : 13/666280 | |
| DATED | : February 20, 2018 | |
| INVENTOR(S) | : Andrew Nguyen et al. | |

It is certified that error appears in the above-identified patent and that said Letters Patent is hereby corrected as shown below:

Column 13, Line 9, in Claim 1, delete "first" and insert -- said first -- therefor.

Column 13, Line 41, in Claim 8, delete "an" and insert -- said -- therefor.

Column 14, Line 52, in Claim 15, delete "an" and insert -- said -- therefor.

Signed and Sealed this
Twenty-fourth Day of April, 2018

Andrei Iancu
*Director of the United States Patent and Trademark Office*